United States Patent
Lee et al.

(10) Patent No.: US 8,617,932 B2
(45) Date of Patent: Dec. 31, 2013

(54) DISPLAY DEVICE, ORGANIC LIGHT EMITTING DIODE DISPLAY, AND MANUFACTURING METHOD OF SEALING SUBSTRATE

(75) Inventors: Jung-Min Lee, Yongin (KR); Choong-Ho Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 193 days.

(21) Appl. No.: 13/183,264

(22) Filed: Jul. 14, 2011

(65) Prior Publication Data

US 2012/0126258 A1    May 24, 2012

(30) Foreign Application Priority Data

Nov. 19, 2010  (KR) .................. 10-2010-0115857

(51) Int. Cl.
  *H01L 21/00* (2006.01)
  *G02F 1/1333* (2006.01)

(52) U.S. Cl.
  USPC .......................................... 438/121; 349/190

(58) Field of Classification Search
  USPC ................ 438/116, 119, 121; 349/153, 190
  See application file for complete search history.

(56) References Cited

U.S. PATENT DOCUMENTS 6,998,776 B2  2/2006 Aitken et al.
7,537,504 B2  5/2009 Becken et al.

FOREIGN PATENT DOCUMENTS

| | | |
|---|---|---|
| JP | 2003-006600 A | 1/2003 |
| JP | 2004-296608 A | 10/2004 |
| JP | 2006-528842 A | 12/2006 |
| KR | 10-2006-0121309 A | 11/2006 |
| KR | 10-2008-0088031 A | 10/2008 |
| WO | 2005/013652 A1 | 2/2005 |

*Primary Examiner* — William D Coleman
(74) *Attorney, Agent, or Firm* — Knobbe Martens Olson & Bear, LLP

(57) ABSTRACT

A display device includes a display unit, a sealing substrate, a first metal layer, a second metal layer, and a conductive wire member. The display unit is formed over a substrate. A sealing substrate is secured to the substrate by a bonding layer, and comprising a composite member and an insulating member. A first metal layer is formed over the inner surface of the sealing substrate facing the substrate, and a second metal layer is formed over the outer surface of the sealing substrate. A conductive wire member successively passes through at least two points of each of the first metal layer, the insulating member, and the second metal layer, and is secured to the sealing substrate to provide conduction of the first metal layer and the second metal layer.

33 Claims, 17 Drawing Sheets

100

DISPLAY DEVICE, ORGANIC LIGHT EMITTING DIODE DISPLAY, AND MANUFACTURING METHOD OF SEALING SUBSTRATE

RELATED APPLICATIONS

This application claims priority to and the benefit of Korean Patent Application No. 10-2010-0115857 filed in the Korean Intellectual Property Office on Nov. 19, 2010, the entire contents of which are incorporated herein by reference.

BACKGROUND

1. Field

The present disclosure relates generally to a display device, and more particularly, to an organic light emitting diode display device.

2. Description of the Related Technology

Among display devices, an organic light emitting diode display is of a flat panel design and self-luminous.

An organic light emitting diode display is equipped with a self-luminous organic light emitting diode to display an image. A display unit including a plurality of organic light emitting diodes is functionally degraded when exposed to moisture and oxygen, and hence a technique for suppressing the permeation of external moisture and oxygen by sealing a display unit is required.

The above information disclosed in this Background section is only for enhancement of understanding of the background of the described technology and therefore it may contain information that does not form the prior art that is already known in this country to a person of ordinary skill in the art.

SUMMARY

One aspect of the invention provides a display device, an organic light emitting diode display, and a manufacturing method of a sealing substrate, which can improve the sealing function of a display unit.

An embodiment provides a display device including: a substrate; a display unit formed over the substrate; a sealing substrate secured to the substrate by a bonding layer, and comprising a composite member and an insulating member; a first metal layer formed over the inner surface of the sealing substrate facing the substrate; a second metal layer formed over the outer surface of the sealing substrate; and a conductive wire member successively passing through at least two points of each of the first metal layer, the insulating member, and the second metal layer, and secured to the sealing substrate to provide conduction of the first metal layer and the second metal layer.

The conductive wire member may comprise staples or metal threads.

Each of the staples may include: a head portion contacting with any one of the first and second metal layers; a pair of penetrating portions passing through the first metal layer, the insulating member, and the second metal layer; and a pair of securing portions bent from the penetrating portions and contacting with the other one of the first and second metal layers.

Each of the metal threads may include: a plurality of first contact portions contacting with the first metal layer; a plurality of penetrating portions passing through the first metal layer, the insulating member, and the second metal layer; and a plurality of second contact portions contacting with the second metal layer.

The composite member may include a resin matrix and a plurality of carbon fibers, and the insulating member may be coupled to a periphery of the composite member.

The insulating member may comprise a polymer resin or a fiber-reinforced composite material, and the conductive wire member may be mounted on the insulating member before a baking process.

The fiber-reinforced composite material may include a resin matrix and a plurality of reinforcing fibers, and the reinforcing fibers may include either glass fibers or aramid fibers.

The first metal layer may include a first inner layer portion being in contact with the insulating member and a second inner layer portion being in contact with the composite member, and the second metal layer may include a first outer layer portion and a second outer layer portion that are in contact with the insulating member and disposed at a distance from each other.

An embodiment provides an organic light emitting diode display including: a substrate; a display unit formed over the substrate and including a common power line and a common electrode; a sealing substrate secured to the substrate by a bonding layer, and comprising a composite member and an insulating member; a first conductive wire member and a second conductive wire member that successively pass through at least two points of the insulating member, and are secured to the insulating member; a first conductor formed over the inner and outer surfaces of the sealing substrate, and keeping in an electrically conductive state through the first conductive wire member such that a first electrical signal is applied to the common power line through the first conductor; and a second conductor formed over the inner and outer surfaces of the sealing substrate, and keeping in an electrically conductive state through the first conductive wire member such that a second electrical signal is applied to the common electrode.

The organic light emitting diode display may further include: a pad unit located outside the display unit, and including first pad regions connected to a common power line and second pad regions connected to the common electrode; and a conductive bonding layer located between the first pad regions and the first conductor and between the second pad regions and the second conductor.

The common power line may further include a first common power line and a second common power line that cross each other, and the first pad regions and the second pad regions may be alternately and repeatedly disposed along one direction of the substrate. The conductive bonding layer may be conductive in the thickness direction, and may be substantially non-conductive or insulating in directions other than the thickness direction.

In another aspect, the organic light emitting diode display may further include: first pad regions located outside the display region and connected to the common power line; and a conductive bonding layer located between the first pad regions and the first conductor. The second conductor may be in close contact with the common electrode.

The organic light emitting diode display may further include a plurality of spacers disposed under the common electrode, and the common electrode may have projections corresponding to the spacers.

The composite member may include a resin matrix and a plurality of carbon fibers, and the insulating member may be coupled to a periphery of the composite member.

The first conductor may include: first inner layer portions formed over the inner surface of the insulating member; and a first outer layer portion electrically conducted with the first inner layer portions by a first conductive wire member and formed over the outer surface of the insulating member. The second conductor may include: a second inner layer portion formed across the inner surface of the insulating member and the inner surface of the composite member; and a second outer layer portion electrically conducted with the second inner layer portion by a second conductive wire member and formed over the outer surface of the insulating member.

The second inner layer portion may have a size large enough to face the display unit and have extensions formed over the insulating member, and the first inner layer portions may be located between the extensions at a distance from the extensions.

The second inner layer portion may be formed of any one of an aluminum film, a copper film, an aluminum foil, and a copper foil.

The first conductive wire member may be formed from a plurality of first staples, and the second conductive wire member may be formed from a plurality of second staples.

Each of the first staples may include: a head portion contacting with any one of the first inner layer portion and the first outer layer portion; a pair of penetrating portions passing through the first inner layer portion, the insulating member, and the first outer layer portion; and a pair of securing portions bent from the penetrating portions and contacting with the other one of the first inner layer portion and the first outer layer portion.

Each of the second staples may include: a head portion contacting with any one of the second inner layer portion and the second outer layer portion; a pair of penetrating portions passing through the second inner layer portion, the insulating member, and the second outer layer portion; and a pair of securing portions bent from the penetrating portions and contacting with the other one of the second inner layer portion and the second outer layer portion.

The first conductive wire member may be formed of a first metal thread, and the second conductive wire member may be formed of a second metal thread.

The first metal thread may include: a plurality of first contact portions being in contact with the first inner layer portion; a plurality of penetrating portions passing through the first inner layer portion, the insulating member, and the first outer layer portion; and a plurality of second contact portions being in contact with the first outer layer portion.

The second metal thread may include: a plurality of first contact portions being in contact with the second inner layer portion; a plurality of penetrating portions passing through the second inner layer portion, the insulating member, and the second outer layer portion; and a plurality of second contact portions being in contact with the second outer layer portion.

The insulating member may comprise a polymer resin or a fiber-reinforced composite material, and the first conductive wire member and the second conductive wire member may be mounted on the insulating member before a baking process.

The fiber-reinforced composite material may include a resin matrix and a plurality of reinforcing fibers, and the reinforcing fibers may include either glass fibers or aramid fibers.

An embodiment provides a manufacturing method of a sealing substrate, the method including: forming a lamination structure including a temporary composite member and a temporary insulating member; disposing a first metal layer over one surface of the lamination structure and a second metal layer over another surface of the lamination structure; and providing electrical conduction of the first metal layer and the second metal layer by passing a conductive wire member through the first metal layer, the temporary insulating member, and the second metal layer.

The manufacturing method of a sealing substrate may further include, after the providing of electrical conduction of the first metal layer and the second metal layer, forming a composite member and an insulating member by curing the temporary composite member and the temporary insulating member by baking.

The temporary composite member may consist of a plurality of composite layers, and the temporary insulating member may consist of insulating layers.

Each of the plurality of composite layers may be a carbon fiber prepreg having a resin matrix and a plurality of carbon fibers, and each of the plurality of insulating layers may be a fiber reinforced prepreg having a resin matrix and reinforced fiber, or a polymer resin sheet.

The first metal layer may include first inner layer portions being in contact with the temporary insulating member and a second inner layer portion located across the temporary composite member and the temporary insulating member. The second metal layer may include a first outer layer portion and a second outer layer portion dispose over the temporary insulating member at a distance from each other.

The conductive wire member may be formed of staples, and may be embedded and secured into overlapping portions of the first metal layer and the second metal layer with an industrial stapler.

In another aspect, the conductive wire member may be formed of metal threads, and the metal threads may be sewn to overlapping portions of the first metal layer and the second metal layer with an industrial sewing machine.

The organic light emitting diode display can improve the sealing function of the display unit, improve the luminance uniformity of the screen while realizing a large-area display unit, and simplify the overall structure and manufacturing process by reducing the number of parts. Furthermore, electrical conduction is easily provided between the first metal layer of the inner surface of the sealing substrate and the second metal layer of the outer surface of the sealing substrate by an automation process in the manufacturing process of a sealing substrate.

DETAILED DESCRIPTION

Figure 1:
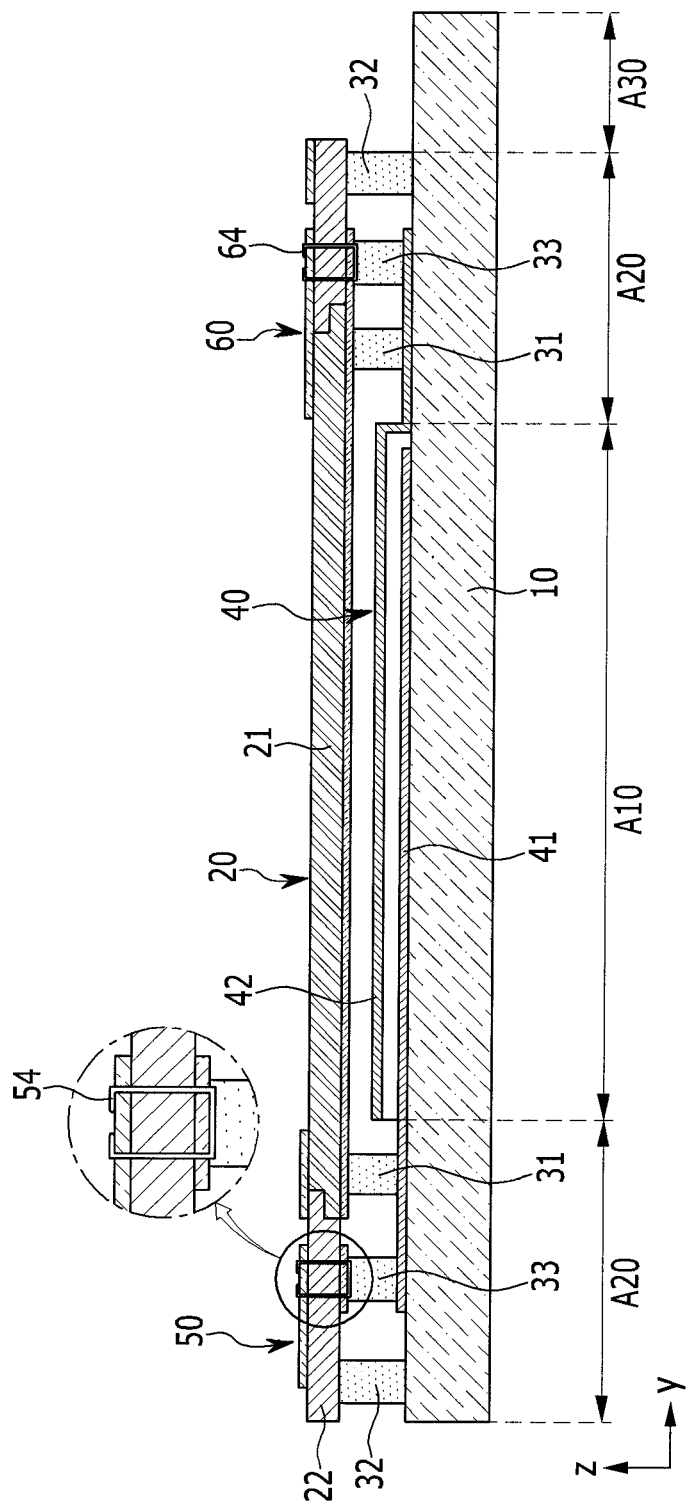
FIG. 1 is a cross-sectional view schematically showing an organic light emitting diode display according to a first embodiment.

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

In order to clarify embodiments of the present invention, elements extrinsic to the description are omitted from the details of this description, and like reference numerals refer to like elements throughout the specification. The size and thickness of each component shown in the drawings are arbitrarily shown for better understanding and ease of description, and thus the present invention is not limited to those shown in the drawings.

Throughout the specification, it will be understood that when an element such as a layer, film, region, unit, area or panel is referred to as being "on" another element, it can be directly on the other element or intervening elements may also be present.

FIG. 1 is a cross-sectional view schematically showing an organic light emitting diode display according to a first embodiment.

Referring to FIG. 1, the organic light emitting diode display 100 of the first embodiment comprises a substrate 10, a display unit 40 formed on the substrate 10, and a sealing substrate 20 secured to the substrate 10 by bonding layers 31 and 32 surrounding the display unit 40. The substrate 10 comprises a display area A10 in which the display unit 40 is located and a non-display area located outside the display area A10. The non-display area may be divided into a wiring and sealing area A20 and a pad area A30.

The display unit 40 comprises a plurality of pixels, each pixel having an organic light emitting diode and a driving circuit disposed therein. The organic light emitting diode comprises a pixel electrode, an organic emission layer, and a common electrode 42. The driving circuit comprises at least two thin film transistors including a switching thin film transistor and a driving thin film transistor and at least one capacitor.

Moreover, each pixel has a gate line, a data line, and a common power line 41 located therein. The gate line supplies a scan signal, and the data line supplies a data signal. The common power line 41 applies a common voltage to the driving thin film transistor. The common power line 41 may be parallel to the data line, or may comprise a first common power line arranged parallel to the data line and a second common power line arranged parallel to the gate line.

A detailed structure of the display unit 40 will be described later, and FIG. 1 schematically illustrates the display unit 40 having the common power line 41 and the common electrode 42 formed therein.

The bonding layers 31 and 32 comprise a first bonding layer 31 surrounding the display unit 40 and a second bonding layer 32 located outside the first bonding layer 31 and surrounding the first bonding layer 31. A conductive bonding layer 33 is located between the first bonding layer 31 and the second bonding layer 32. The first bonding layer 31 and the second bonding layer 32 contain no conductive material, and may contain thermally curable resin, for example, epoxy resin. A moisture absorbing filler (not shown) is located between the substrate 10 and the sealing substrate 20 inside the first bonding layer 31.

Of the above-described organic light emitting diode display 100, the common power line 41 and the common electrode 42 are not connected to a flexible printed circuit board (not shown) attached to the pad area A30. Instead, the common power line 41 is connected to a first conductor 50 provided in the sealing substrate 20 and receives a corresponding electrical signal from the first conductor 50, and the common electrode 42 is connected to a second conductor 60 provided in the sealing substrate 20 and receives a corresponding electrical signal from the second conductor 60.

Thus, the organic light emitting diode display 100 can realize a large-area display unit 40, and uniformly apply the corresponding electrical signals to the common power line 41 and the common electrode 42 without having the pad area A30 formed at four edges on the upper, lower, left, and right sides of the substrate 10. As a result, non-uniformity in luminance resulting from the manufacture of the large-area display unit 40 can be prevented, and the overall structure and manufacturing process of the organic light emitting diode display 100 can be simplified.

Figure 2:
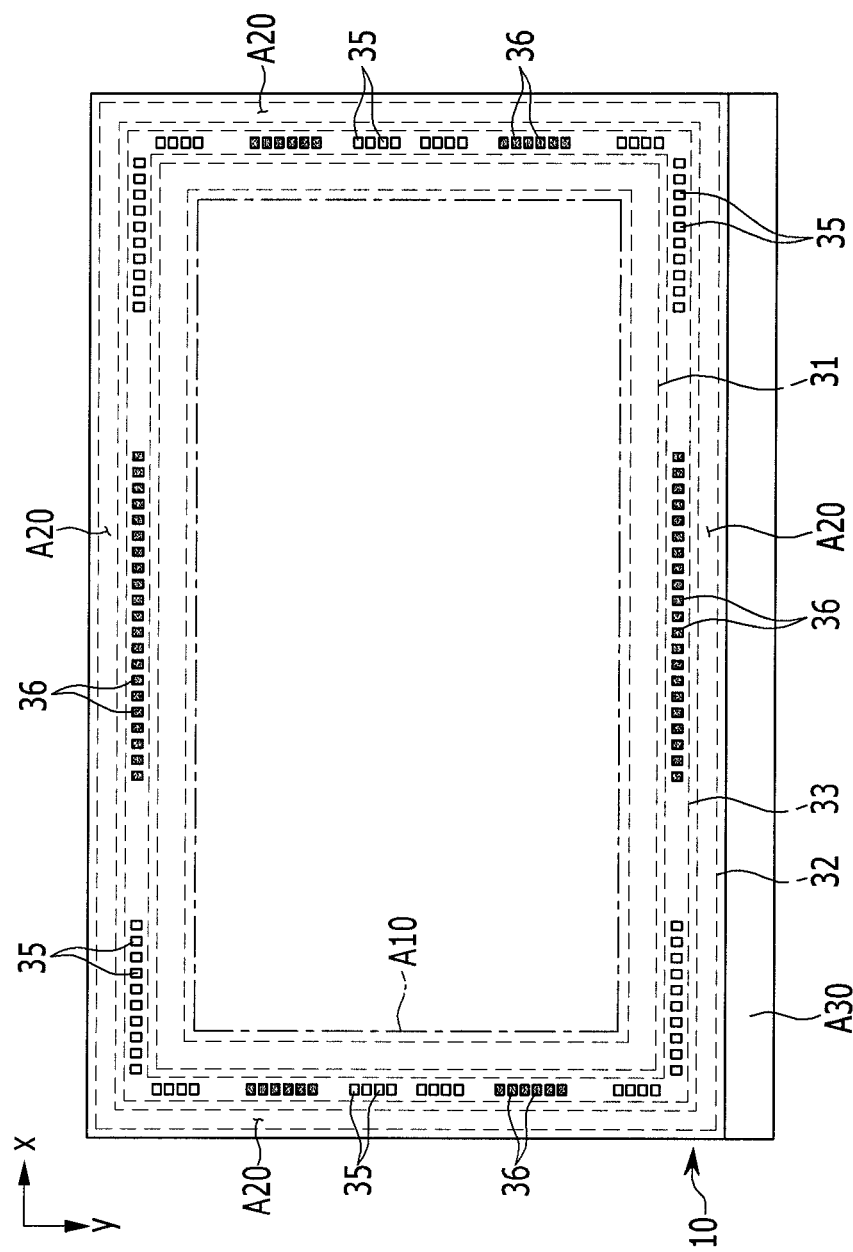
FIG. 2 is a plan view of a substrate of the organic light emitting diode display shown in FIG. 1.

FIG. 2 is a plan view of a substrate of the organic light emitting diode display shown in FIG. 1.

Referring to FIGS. 1 and 2, the wiring and sealing area A20 is located on the outer sides of four edges of the display area A10. The first bonding layer 31, the conductive bonding layer 33, and the second bonding layer 32 are located in the wiring and sealing area A20. The pad area A30 is located along any one of the edges of the substrate 10 outside the wiring and sealing area A20. Although FIG. 2 illustrates that the pad area A30 is located on the lower long side of the substrate 10, the position of the pad area A30 is not limited to the illustrated example.

First pad regions 35 electrically connected to the common power line 41 of the display unit 40 and second pad regions 36 electrically connected to the common electrode 42 are located in the wiring and sealing area A20. The first pad regions 35 and the second pad regions 36 are formed in all four parts of the wiring and sealing areas A20, and may be alternately and repeatedly disposed along one direction of the substrate 10. FIG. 2 illustrates the second pad regions 36 in a dot pattern in order to distinguish the first pad regions 35 from the second pad regions 36.

Of the plurality of first pad regions 35, the first pad region 35 located on a long side of the substrate 10 is connected to a first common power line, and the first pad region 35 located on a short side of the substrate 10 is connected to a second common power line. The first pad regions 35 and second pad regions 36 shown in FIG. 2 are schematically shown, the positions, numbers, etc. thereof are not limited to the illustrated example.

The first pad regions 35 and the second pad regions 36 are formed at positions corresponding to the conductive bonding layer 33 in the wiring and sealing area A20. At this point, the conductive bonding layer 33 is conductive only in the thickness direction (z-axis direction in the figure), and not conductive in other directions. Therefore, the first pad regions 35 and the second pad regions 36 are not short-circuited even if one conductive bonding layer 33 contacts with both of the first pad regions 35 and the second pad regions 36.

Alternatively, a conductive bonding layer having conductivity in all directions may be used. In this case, the conductive bonding layer is formed divided into a first conductive layer (not shown) located corresponding to the first pad regions 35 and a second conductive layer (not shown) located corresponding to the second pad regions 36. The first conductive bonding layer and the second conductive bonding layer maintain a distance from each other so as to prevent the first and second conductive bonding layers from electrical conduction therebetween.

Figure 3:
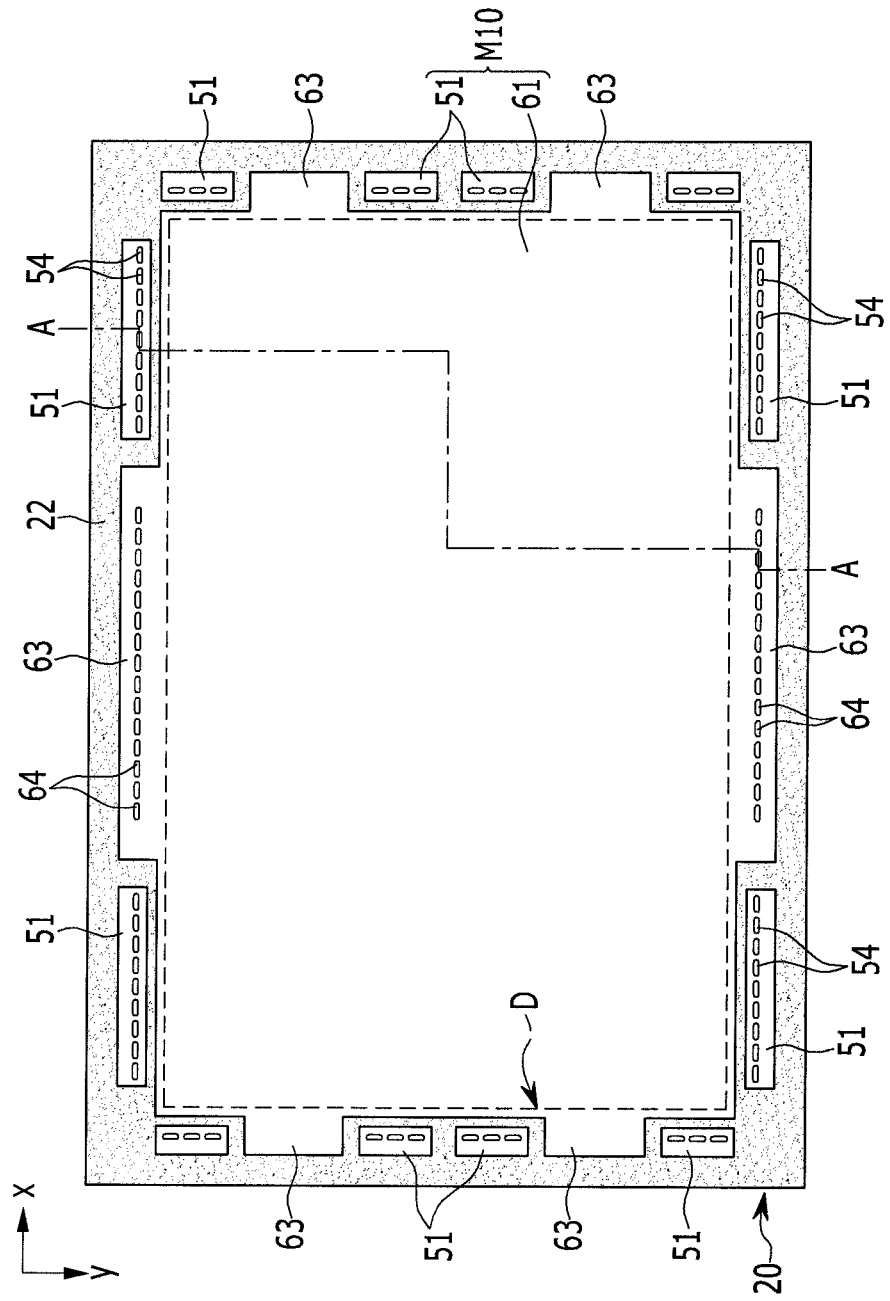
FIG. 3 is a plan view showing the inner surface of the sealing substrate of the organic light emitting diode display shown in FIG. 1.
Figure 4:
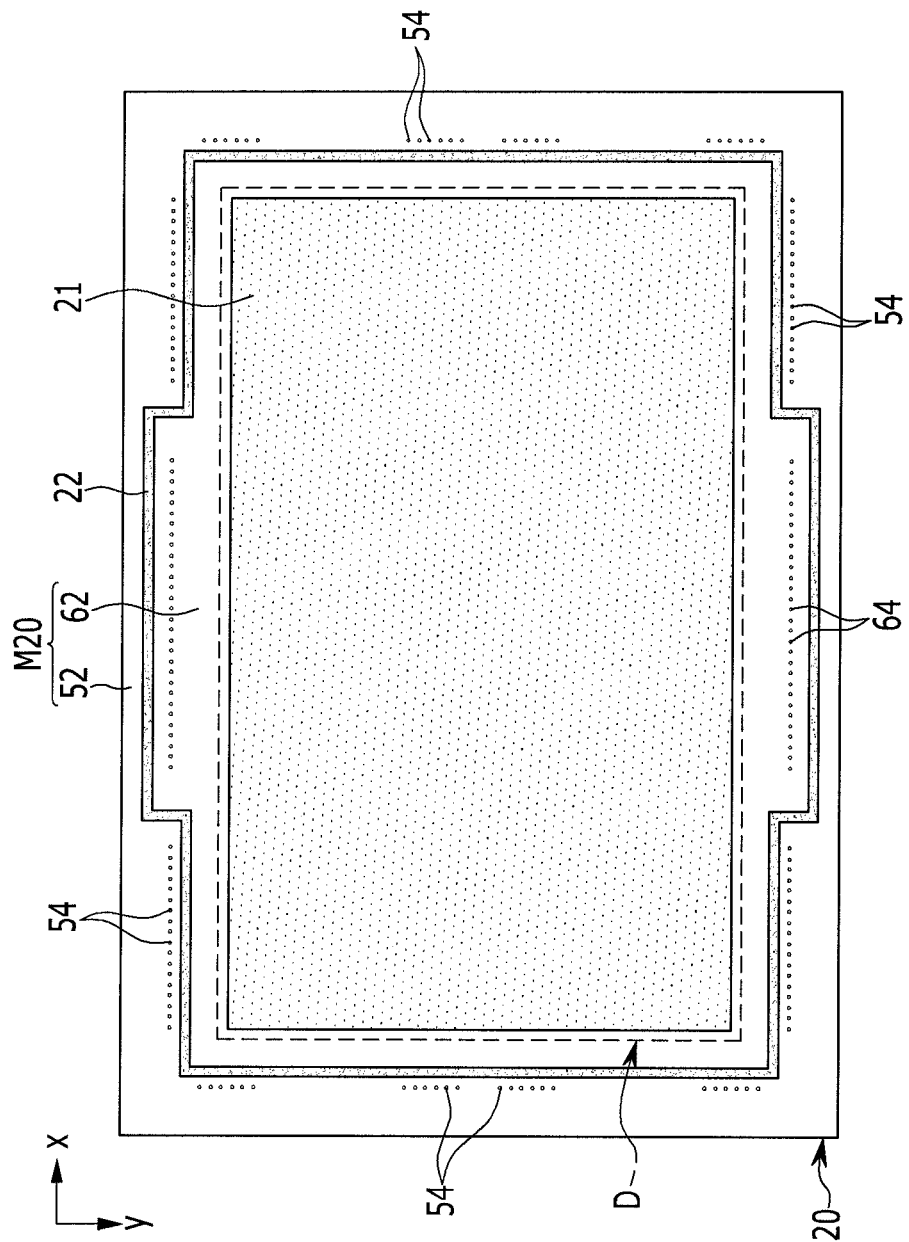
FIG. 4 is a plan view showing the outer surface of the sealing substrate of the organic light emitting diode display shown in FIG. 1.
Figure 5:
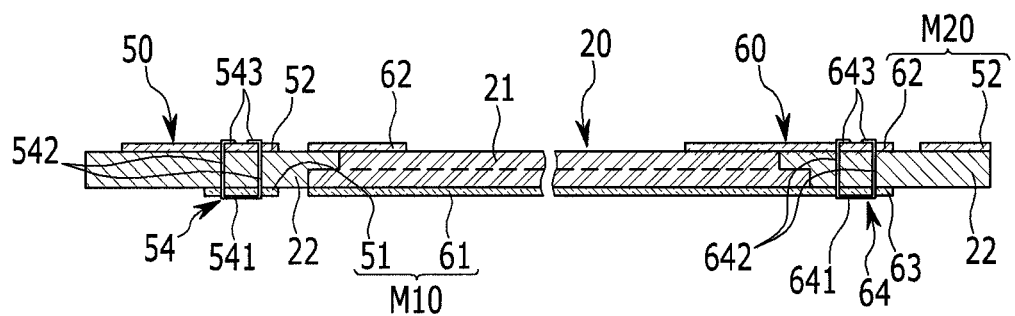
FIG. 5 is a cross-sectional view taken along line A-A of FIG. 3.

FIG. 3 and FIG. 4 are plan views respectively showing the inner and outer surfaces of the sealing substrate of the organic light emitting diode display shown in FIG. 1, and FIG. 5 is a cross-sectional view taken along line A-A of FIG. 3. Line D indicated in dotted line in FIG. 3 and FIG. 4 represents the boundary line between a composite member 21 and an insulating member 22.

Referring to FIGS. 1 to 5, the sealing substrate 20 has a size that covers the display area A10 of the substrate 10 and the four parts of the wiring and sealing area A20. Accordingly, the pad area A30 of the substrate 10 is exposed to the outside without overlapping with the sealing substrate 20.

The sealing substrate 20 is composed of the composite member 21 containing a resin matrix and a plurality of carbon fibers and the insulating member 22 coupled to the periphery of the composite member 21. The composite member 21 has a size large enough to face the entire display unit 40 and the first bonding layer 31, and the insulating member 22 faces the four parts of the wiring and sealing area A20. The insulating member 22 may comprise a polymer resin or a fiber-reinforced composite material. The reinforcing fibers used herein may be glass fibers or aramid fibers.

The composite member 21 may have a thermal expansion coefficient almost similar to that of the substrate 10 by adjusting the content of the carbon fibers and the content of the resin matrix. Accordingly, when attaching the substrate 10 and the sealing substrate 20 together by curing the first and second bonding layers 31 and 32 and the conductive bonding layer 33 at a high temperature, there occurs no bending caused by differences in the thermal expansion coefficient between the substrate 10 and the sealing substrate 20, and also there occurs no bending in an environmental reliability test to be performed after the bonding.

The insulating member 22 has the same thickness as the composite member 21 and constitutes a flat sealing substrate 20. For example, the composite member 21 has a lamination structure of at least two layers having different sizes, and the insulating member 22 may be in contact with the sides of at least two layers and have the same thickness as the composite member 21. With the sealing substrate 20 configured in a flat design, bonding defects can be prevented in the process of attaching the substrate 10 and the sealing substrate 20 together.

Moreover, the composite member 21 can have a small thickness of about 1 mm because it shows high mechanical properties due to its high strength carbon fibers contained therein. By configuring the boundary surface between the composite member 21 and the insulating member 22 as shown in FIG. 5, the bonding area of the composite member 21 and the insulating member 22 is increased, and therefore the bonding strength is enhanced, thus avoiding the defect of separating the composite member 21 and the insulating member 22 from each other.

The shape of the boundary surface of the composite member 21 and the insulating member 22 is not limited to that of FIG. 5 but may be modified in various manners. Detailed structures and constituent materials of the composite member 21 and the insulating member 22 will be described later.

The first conductor 50 for applying an electrical signal to the common power line 41 and the second conductor 60 for applying an electrical signal to the common electrode 42 are located on the inner and outer surfaces of the sealing substrate 20 and are insulated from each other. The first conductor 50 and the second conductor 60 each comprise a first metal layer M10 disposed on the inner surface of the sealing substrate 20, a second metal layer M20 disposed on the outer surface of the sealing substrate 20, and a conductive wire member passing through the first metal layer M10, the insulating member 22, and the second metal layer M20, and secured to the sealing substrate 20 to provide electrical conduction of the two metal layers M10 and M20. The conductive wire member consecutively penetrates at least two points of each of the first metal layer M10, the insulating member 22, and the second metal layer M20.

Specifically, the first conductor 50 comprises first inner layers 51 formed on the inner surface of the insulating member 22 and a first outer layer 52 formed on the outer surface of the insulating member 22. The second conductor 60 comprises a second inner layer 61 formed across the inner surface of the composite member 21 and the inner surface of the insulating member 22 and a second outer layer 62 formed across the outer surface of the composite member 21 and the outer surface of the insulating member 22.

The second inner layer 61 covers the entire display unit 40, and has a size large enough to make contact with the first bonding layer 31. The second inner layer 61 may be formed from a metal layer, for example, an aluminum film or copper film, which is low in resistance and superior in the effect of blocking moisture and oxygen. Moreover, the second inner layer 61 may be formed from a metal foil containing aluminum or copper.

The moisture and oxygen from the outside of the organic light emitting diode display 100 is blocked firstly by the composite member 21 having a dense structure, and then blocked secondly by the second inner layer 61. Accordingly, the composite member 21 with the second inner layer 61 obtains high airtightness like a glass substrate does.

The second inner layer 61 has a plurality of extensions 63 placed in contact with the conductive bonding layer 33 so as to overlap with the second pad portions 36 of the substrate 10. As such, the second pad regions 35 of the substrate 10 are electrically connected to the second inner layer 61 via the conductive bonding layer 33 and the plurality of extensions 63. The first inner layers 51 are located between the extensions 63 of the second inner layer 61, and overlap with the first pad regions 35 of the substrate 10 with the conductive bonding layer 33 interposed therebetween. Therefore, the first pad regions 35 of the substrate 10 are electrically connected to the first inner layers 51 via the conductive bonding layer 33.

The first outer layer 52 is located on the outer surface edge of the insulating member 22, and the second external layer 62 is located at a distance from the first outer layer 52 on the inside of the first outer layer 52. Both of the first outer layer 52 and the second outer layer 62 can be formed in a rectangular frame shape. The first inner layers 51, the first outer layer 52, and the second outer layer 62 are formed of the same metal layer as the second inner layer 61.

Although electrical conduction is provided between the composite member 21 and the second conductor 60 because the second inner layer 61 is formed immediately above the composite member 21, the first conductor 50 and the second conductor 60 are not short-circuited each other because the first inner layers 51 and the first external layer 52 are located on the insulating member 22 at a distance from the second conductor 60.

The first conductor 50 and the second conductor 60 comprise metal staples 54 and 64 as a conductive wire member. The first conductor 50 comprises a plurality of first staples 54 which pass through the first outer layer 52, the insulating member 22, and the first inner layer, and are secured to the insulating member 22 to provide electrical conduction of the first inner layers 51 and the first outer layer 52. The second conductor 60 comprises a plurality of second staples 64 which pass through the second outer layer 62, the insulating member 22, and at least one extension 63, and are secured to the insulating member 22 to provide electrical conduction of the second outer layer 62 and the extensions 63.

The first staples 54 and the second staples 64 may be secured to the insulating member 22 using an industrial stapler. Each of the first staples 54 includes a head portion 541 being in contact with the outer surface of the first inner layer 51, a pair of penetrating portions 542 passing through the first inner layer 51, the insulating member 22, and the first outer layer 52, and a pair of securing portions 543 bent from the penetrating portions 542, and being in contact with the outer surface of the first outer layer 52. The pair of securing portions 543 may be bent toward the inside of the pair of penetrating portions 542.

Each of the second staples 64 includes a head portion 641 being in contact with the outer surface of the second inner layer 61, a pair of penetrating portions 642 passing through the extensions 63 of the second inner layer 61, the insulating member 22, and the second outer layer 62, and a pair of securing portions 643 bent from the penetrating portions 642, and being in contact with the outer surface of the second outer layer 62. The pair of securing portions 643 may be bent toward the inside of the pair of penetrating portions 642.

Although the foregoing description has been given with respect to the head portions 541 and 641 of the first and second staples 54 and 64 coming into contact with the first inner layer 51 and the extensions 63 of the second inner layer 61, the head portions 541 and 641 of the first and second staples 54 and 64 may come into contact with the first outer layer 52 and the second outer layer 62.

The first staples 54 and the second staples 64 are made of metals such as iron (Fe), gold (Au), silver (Ag), and copper (Cu), to provide electrical conduction of the first outer layer 52 and the first inner layer 51 and electrical conduction of the second outer layer 62 and the extensions 63 of the second inner layer 61. When metals coated with gold (Au) or silver (Ag) are used as the first staples 54 and the second staples 64, the electrical resistance of the first staples 54 and the second staples 64 can be further lowered. The plurality of first staples 54 are disposed in parallel at a distance from each other, and the plurality of second staples 64 are also disposed in parallel at a distance from each other.

In the above-described structure, the first metal layer M10 indicates the first inner layers 51 and the second inner layer 61 including the extensions 63, and the second metal layer M20 indicates the first outer layer 52 and the second outer layer 62.

According to the above-described conduction structure of the first metal layer M10 and the second metal layer M20, the first metal layer M10, the sealing substrate 20, and the second metal layer M20 are laminated, and then the plurality of staples 54 and 64 are easily secured to the sealing substrate 20 with an industrial stapler. Accordingly, electrical conduction can be easily provided between the first metal layer M10 and the second metal layer M20 by an automation process, and the firmness and durability of the sealing substrate 20 can be enhanced because the staples 54 and 64 are firmly embedded into the sealing substrate 20 and thus hardly removed.

Figure 6:
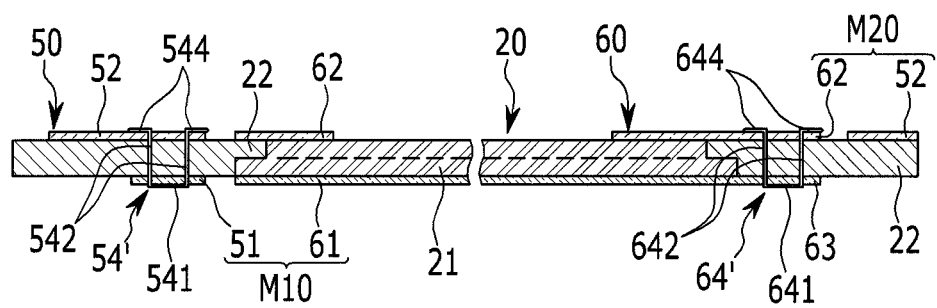
FIG. 6 is a cross-sectional view showing a modified example of the staples of the sealing substrate shown in FIG. 5.

FIG. 6 is a cross-sectional view showing a modified example of the staples of the sealing substrate shown in FIG. 5.

Referring to FIG. 6, a pair of securing portions 544 of a first staple 54' is bent toward the outside of a pair of penetrating portions 542, and a pair of securing portions 644 of a second staple 64' is bent toward the outside of a pair of penetrating portions 642. In this case, if the length of the securing portions 544 and 644 is increased, the contact resistance of the first staple 54' and the first inner layer 51 can be reduced, and the contact resistance of the second staple 64', the second inner layer 61, and the extensions 63 can be reduced.

Figure 7:
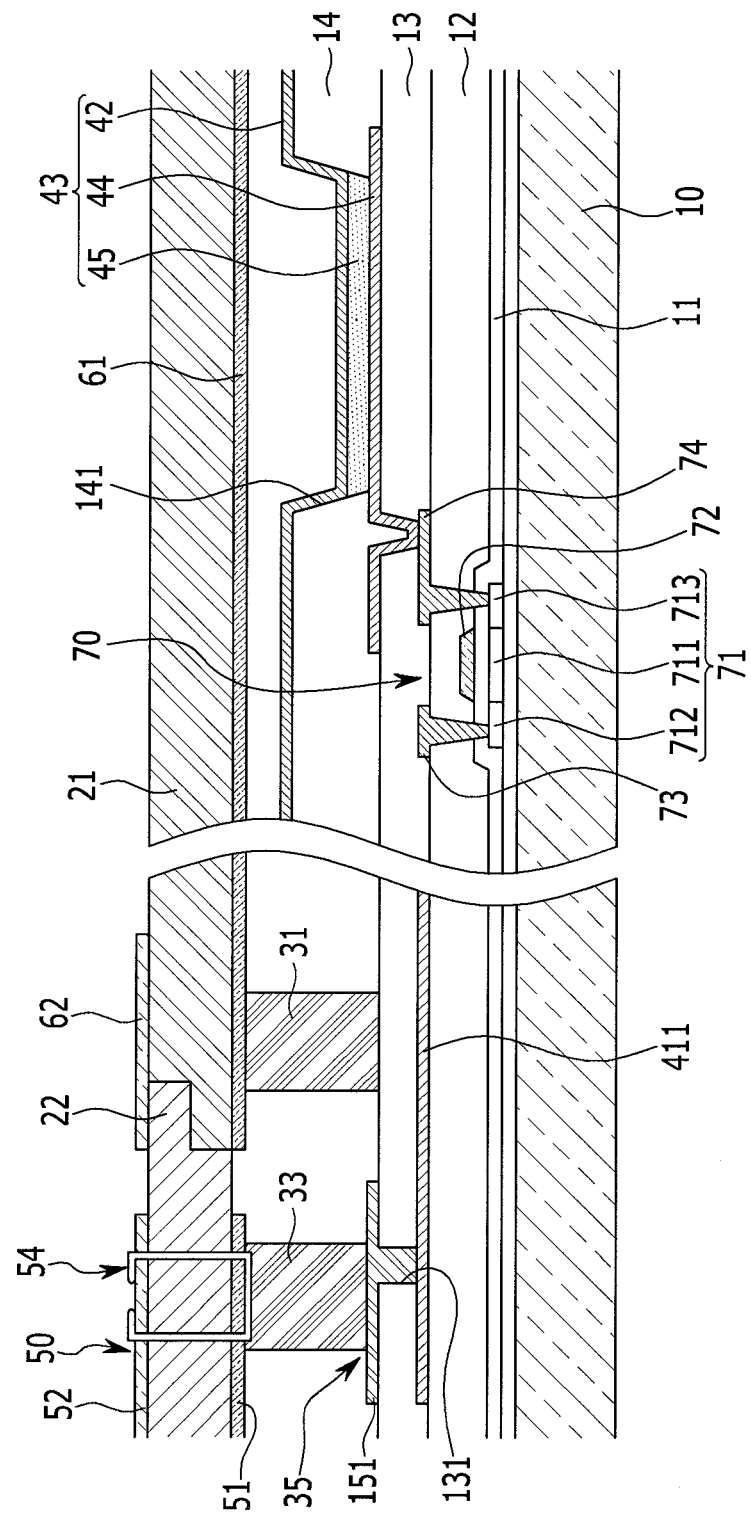
FIGS. 7 to 9 are partial enlarged cross-sectional views of the organic light emitting diode display according to the first embodiment.
Figure 8:
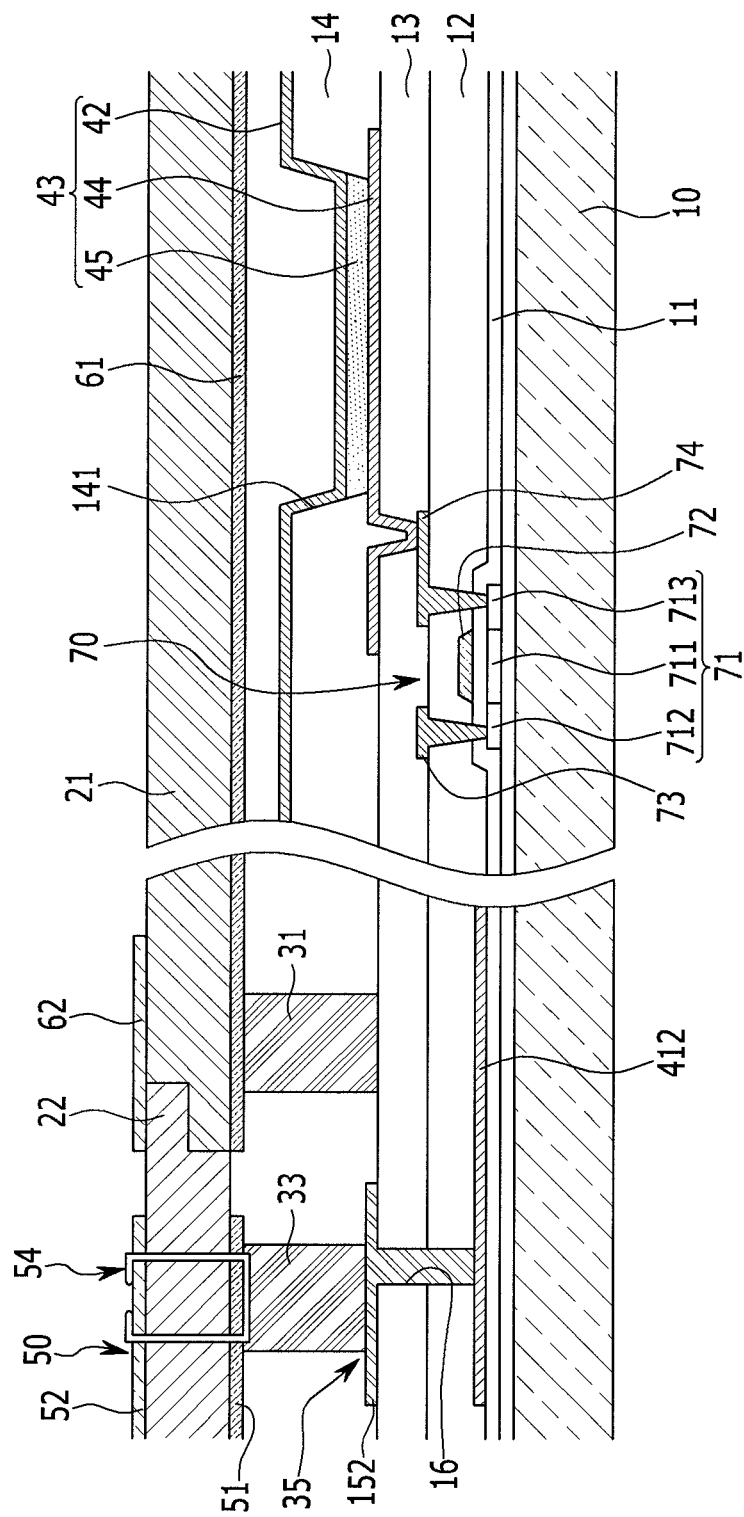
Figure 9:
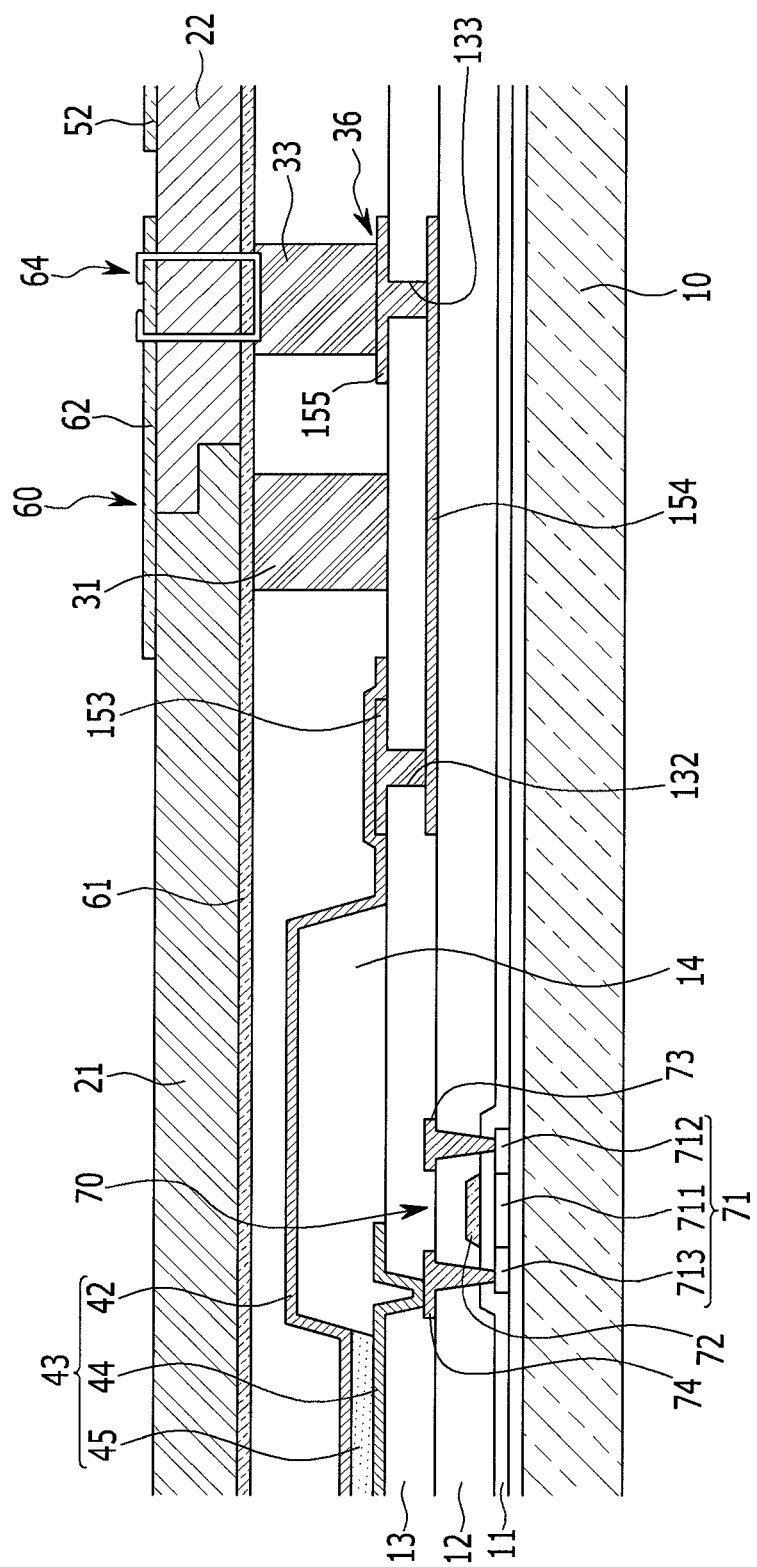

FIGS. 7 to 9 are partial enlarged cross-sectional views of the organic light emitting diode display according to the first embodiment. FIG. 7 illustrates in detail the first common power line and the first pad regions, and FIG. 8 illustrates in detail the second common power line and the first pad regions. FIG. 9 illustrates in detail the common electrode and the second pad regions.

Referring to FIGS. 7 to 9, each pixel of the display unit 40 has an organic light emitting diode 43 and a driving circuit as described above. The driving circuit includes at least two thin film transistors and at least one capacitor. FIGS. 7 to 9 schematically illustrate that one thin film transistor 70 and one organic light emitting diode 43 are located in the display unit 40.

The thin film transistor 70 comprises a semiconductor layer 71, a gate electrode 72, a source electrode 73, and a drain electrode 74. The semiconductor layer 71 is formed of a polysilicon film, and comprises a channel area 711, a source area 712, and a drain area 713. The channel area 711 is a pure semiconductor doped with no impurity, and the source area 712 and the drain area 713 are impurity-doped semiconductors.

A gate electrode 72 is disposed on the channel area 711 of the semiconductor layer 71 with a gate insulating film 11 interposed therebetween. A source electrode 73 and a drain electrode 74 are disposed on the gate electrode 72 with an interlayer insulating film 12 interposed therebetween, and are respectively connected to the source area 712 and the drain area 713 via a contact hole formed in the interlayer insulating film 12. A planarization film 13 is formed on the source electrode 73 and the drain electrode 74, and a pixel electrode 44 is disposed on the planarization film 13. The pixel electrode 44 is connected to the drain electrode 74 via a contact hole of the planarization film 13.

A pixel defining film 14 is disposed over the pixel electrode 44 and the planarization film 13. The pixel defining film 14 has a first opening 141 formed at each pixel to partially expose the pixel electrode 44. An organic emission layer 45 is formed on the exposed pixel electrode 44, and a common electrode 42 is formed all over the display unit 40 so as to cover the organic emission layer 45 and the pixel defining film 14. The pixel electrode 44, the organic emission layer 45, and the common electrode 42 constitute an organic light emitting element diode 43.

The pixel electrode 44 may be a hole injection electrode, and the common electrode 42 may be an electron injection electrode. In this case, the organic emission layer 45 includes a hole injection layer (HIL), a hole transport layer (HTL), an emission layer, an electron transport layer (ETL), and an electron injection layer (EIL) that are sequentially stacked on the pixel electrode 44. Holes and electrons are injected into the organic emission layer 45 from the pixel electrode 44 and the common electrode 42. Light is emitted when excitons generated by the combination of the injected holes and electrons are dropped from an exited state to a ground state.

The pixel electrode 44 is formed of a transmissive conductive film, and the common electrode 42 is formed of a reflective conductive film. Light emitted from the organic emission layer 45 is reflected by the common electrode 42 and emitted to the outside through the substrate 10. Such a light emitting structure is called a bottom emission structure. The pixel electrode 44 may have a triple-layered structure of indium oxide (ITO)/silver(Ag)/indium oxide (ITO), and the common electrode 42 may include silver (Ag) or aluminum (Al).

The first common power line 411 and the second common power line 412 may be formed on the same layer as either the gate electrode 72 or the source/drain electrodes 73 and 74. FIG. 7 illustrates that the first common power line 411 is formed of the same material as the source/drain electrodes 73 and 74 on the same layer as the source/drain electrodes 73 and 74, and FIG. 8 illustrates that the second common power line 412 is formed of the same material as the gate electrode 72 on the same layer as the gate electrode 72.

Referring to FIGS. 7 and 8, ends of the first common power line 411 and second common power line 412 extend outward from the display unit 40. Also, at least one of four insulating films formed on the display unit 40 extends outward from the display unit 40. For example, an end of the first common power line 411 may be covered with the planarization film 13, and an end of the second common power line 412 may be covered with the interlayer insulating film 12 and the planarization film 13.

The planarization film 13 has a second opening 131 formed therein to expose the end of the first common power line 411, and a first pad conductive film 151 is formed on the planarization film 13 and electrically connected to the first common power line 411 through the second opening 131. The first pad regions 35 located on the long side of the substrate 10 may be defined by the first pad conductive film 151.

The interlayer insulating film 12 and the planarization film 13 have a third opening 16 formed therein to expose the end of the second common power line 412, and a second pad conductive film 152 is formed on the planarization film 13 and electrically connected to the second common power line 412 through the third opening 16. The first pad regions 35 located on the short side of the substrate 10 may be defined by the second pad conductive film 152. The first pad conductive film 151 and the second pad conductive film 152 may be formed of the same material as the pixel electrode 44 on the same layer as the pixel electrode 44.

Referring to FIG. 9, the common electrode 42 is located inside the first bonding layer 31, and the second pad regions 36 are formed across the inside and outside of the first bonding layer 31 and provide conduction of the common electrode 42 and the conductive bonding layer 33. The second pad regions 36 comprise a third pad conductive film 153, a fourth pad conductive film 154, and a fifth pad conductive film 155.

The third pad conductive film 153 is located inside the first bonding layer 31, and is in contact with the common electrode 42. The fourth pad conductive film 154 is connected to the third pad conductive film 153 through the fourth opening 132 of the planarization film 13, and located across the inside and outside of the first bonding layer 31. The fifth pad conductive film 155 is disposed between the conductive bonding layer 33 and the planarization film 13, and is connected to the fourth pad conductive film 154 through the fifth opening 133 of the planarization film 13.

The third pad conductive film 153 and the fifth pad conductive film 155 may be formed of the same material as the pixel electrode 44 on the same layer as the pixel electrode 44. The fourth pad conductive film 154 may be formed of the same material and on the same layer as either the gate electrode 72 or the source/drain electrodes 73 and 74. FIG. 9 illustrates an example in which the fourth pad conductive film 154 is formed on the same layer as the source/drain electrodes 73 and 74.

The detailed structure of the second pad regions 36 is not limited to the illustrated example, but any configuration is applicable if it enables conduction of the common electrode 42 of the display unit 40 and the conductive bonding layer 33 located outside the display unit 40.

Figure 10:
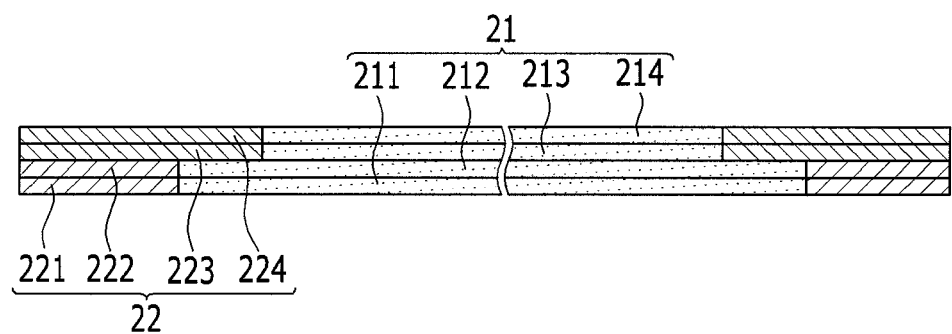
FIG. 10 is a cross-sectional view showing a detailed structure of the sealing substrate shown in FIG. 5.

FIG. 10 is a cross-sectional view showing a detailed structure of the sealing substrate shown in FIG. 5. To facilitate description, the illustrations of the first conductor and the second conductor will be omitted.

Referring to FIG. 10, the composite member 21 and the insulating member 22 has a lamination structure of multiple layers. For example, the composite member 21 may have a lamination structure comprising a first composite layer 212, a third composite layer 213, and a fourth composite layer 214, and the insulating member 22 may have a lamination structure comprising a first insulating layer 221, a second insulating layer 222, a third insulating layer 223, and a fourth insulating layer 224. Each of the first to fourth insulating layers 221 to 224 is in contact with a side of each of the first to fourth composite layers 211 to 214, and has the same thickness as them.

At least one of the first to fourth composite layers 211 to 214 may have a different width from another, and at least one of the first to fourth insulating layers 221 to 224 may have a different width from another.

FIG. 10 illustrates an example in which the first composite layer 211 and the second composite layer 212 have a greater width than the third composite layer 213 and the fourth composite layer 214, and the first insulating layer 221 and the second insulating layer 222 have a smaller width than the third insulating layer 223 and the fourth insulating layer 224. However, the configurations of the composite member 21 and the insulating member 22 are not limited to the illustrated example.

Although the foregoing description has been made with respect to the case where the composite member 21 and the insulating member 22 each has four layers, the number of layers constituting each of the composite member 21 and the insulating member 22 is not limited to the illustrated example and may be varied.

Figure 11:
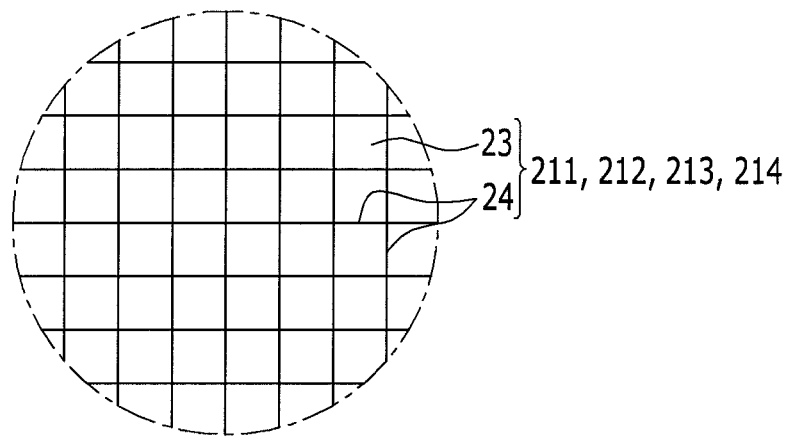
FIG. 11 is an enlarged schematic plan view of a portion of the composite member of the sealing substrate shown in FIG. 10.

FIG. 11 is an enlarged schematic plan view of a portion of the composite member of the sealing substrate shown in FIG. 10.

Referring to FIGS. 10 and 11, each of the first to fourth composite layers 211 to 214 of the composite member 21 comprises a resin matrix 23 and a plurality of carbon fibers 24 impregnated in the resin matrix 23. The plurality of carbon fibers 24 may be disposed to cross each other, and may be woven with warp and weft threads. Although FIG. 11 illustrates the carbon fibers 24 orthogonal to each other, the carbon fibers 24 may cross each other at angles other than the right angle.

The orientation of the carbon fibers 24 is the same in all of the first to fourth composite layers 211 to 214. That is, the carbon fibers 24 of any one layer are not disposed to deviate from the carbon fibers 24 of another layer. The first composite layer 211 to fourth composite layer 214 are cured integrally with the resin matrix 23 by pressure baking, thus constituting a single composite member 21.

The substrate 10 of the organic light emitting diode display 100 is made of glass or polymer resin having a low thermal expansion coefficient because it has to undergo dozens of heat treatment steps to form the driving circuit and the organic light emitting diode 43.

The carbon fibers 24 have a lower thermal expansion coefficient than the substrate 10, and, in particular, the carbon fibers 24 have a negative thermal expansion coefficient in the longitudinal direction. On the contrary, the resin matrix 23 has a higher thermal expansion coefficient than the substrate 10. Accordingly, the thermal expansion coefficient of the composite member 21 can be set to be almost equal to that of the thermal expansion coefficient of the substrate 10 by adjusting the amount of the carbon fibers 24 and the amount of the resin matrix 23.

Figure 12:
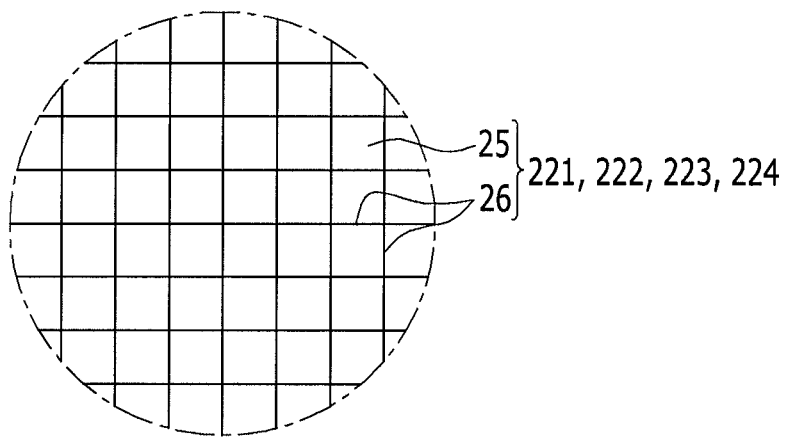
FIG. 12 is an enlarged schematic plan view of a portion of the insulating member of the sealing substrate shown in FIG. 10.

FIG. 12 is an enlarged schematic plan view of a portion of the insulating member of the sealing substrate shown in FIG. 10.

Referring to FIG. 10 and FIG. 12, each of the first to fourth insulating layers 214 of the insulating member 22 comprises a resin matrix 25 and a plurality of reinforcing fibers 26 impregnated in the resin matrix 25. The reinforcing fibers 26 may be glass fibers or aramid fibers. The plurality of reinforcing fibers 26 may be disposed to cross each other, and may be woven with warp and weft threads. Although FIG. 12 illustrates the reinforcing fibers 26 orthogonal to each other, the reinforcing fibers 26 may cross each other at angles other than the right angle.

The orientation of the reinforcing fibers 26 is the same in all of the first to fourth insulating layers 221 to 224. That is, the reinforcing fibers 26 of any one layer are not disposed to deviate from the reinforcing fibers 26 of another layer. The first insulating layer 221 to fourth insulating layer 224 are cured integrally with the resin matrix 25 by pressure baking, thus constituting a single composite member 22.

Alternatively, each of the first to fourth insulating layers 221 to 224 may be formed of polymer resin such as such as polyethylene terephthalate (PET). In this case, too, the first insulating layer 221 to fourth insulating layer 224 are cured integrally with the resin matrix 25 by pressure baking, thus constituting a single composite member 22.

Figure 13:
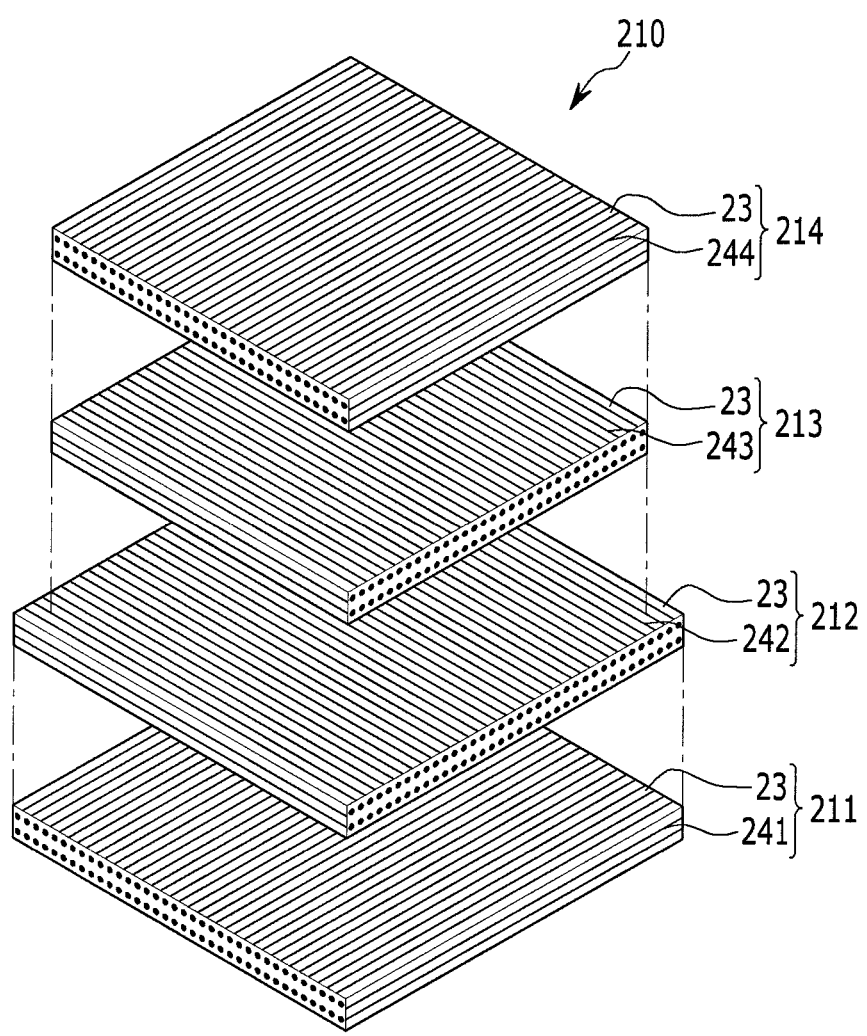
FIGS. 13 and 14 are exploded perspective views respectively showing a composite member and an insulating member in a modified example of the sealing substrate shown in FIG. 10.
Figure 14:
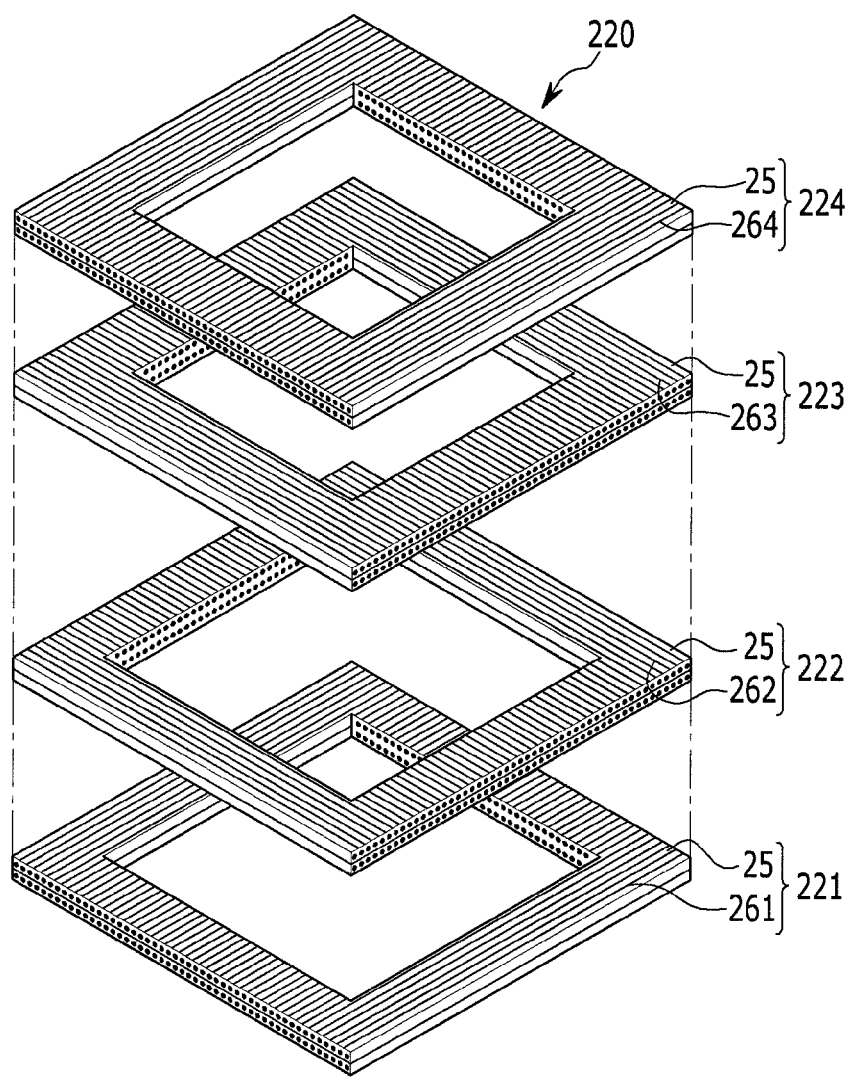

FIGS. 13 and 14 are exploded perspective views respectively showing a composite member and an insulating member in a modified example of the sealing substrate shown in FIG. 10.

Referring to FIG. 13 and FIG. 14, each of the first to fourth composite layers 211 to 214 of the composite member 210 comprises a resin matrix 23 and a plurality of carbon fibers 241, 242, 243, and 244 arranged along one direction in the resin matrix 23. The plurality of carbon fibers 241, 242, 243, and 244 are configured to be impregnated in the resin matrix 23.

The carbon fiber 241 of the first composite layer 211 and the carbon fibers 244 of the fourth composite layer 214 are arranged in a first direction, and the carbon fiber 242 of the second composite layer 212 and the carbon fiber 243 of the third composite layer 213 are arranged in a second direction. The first direction and the second direction may be orthogonal or not. FIG. 13 illustrates an example in which the first direction and the second direction are orthogonal.

Each of the first to fourth insulating layers 221 to 224 of the insulating member 220 comprises a resin matrix 25 and a plurality of reinforcing fibers 261, 262, 263, and 264 arranged along one direction in the resin matrix 25. The plurality of reinforcing fibers 261, 262, 263, and 264 are configured to be impregnated in the resin matrix 25.

The reinforcing fiber 261 of the first insulating layer 221 and the carbon fibers 264 of the fourth insulating layer 224 are arranged in a first direction, and the reinforcing fiber 262 of the second insulating layer 222 and the reinforcing fiber 263 of the third insulating layer 223 are arranged in a second direction. The first direction and the second direction may be orthogonal or not. FIG. 14 illustrates an example in which the first direction and the second direction are orthogonal.

In the sealing substrate having the above-stated configuration, the thermal expansion rate of the composite member 210 in a horizontal direction is equal to that in a vertical direction, and the thermal expansion rate of the insulating member 220 in a horizontal direction is equal to that in a vertical direction. Thus, bending of the sealing substrate can be prevented. In the above-stated configuration, too, the first to fourth composite layers 211 to 214 and the first to fourth insulating layers 221 to 224 are cured integrally with the resin matrix 25 by pressure baking, thus constituting a single sealing substrate.

Figure 15:
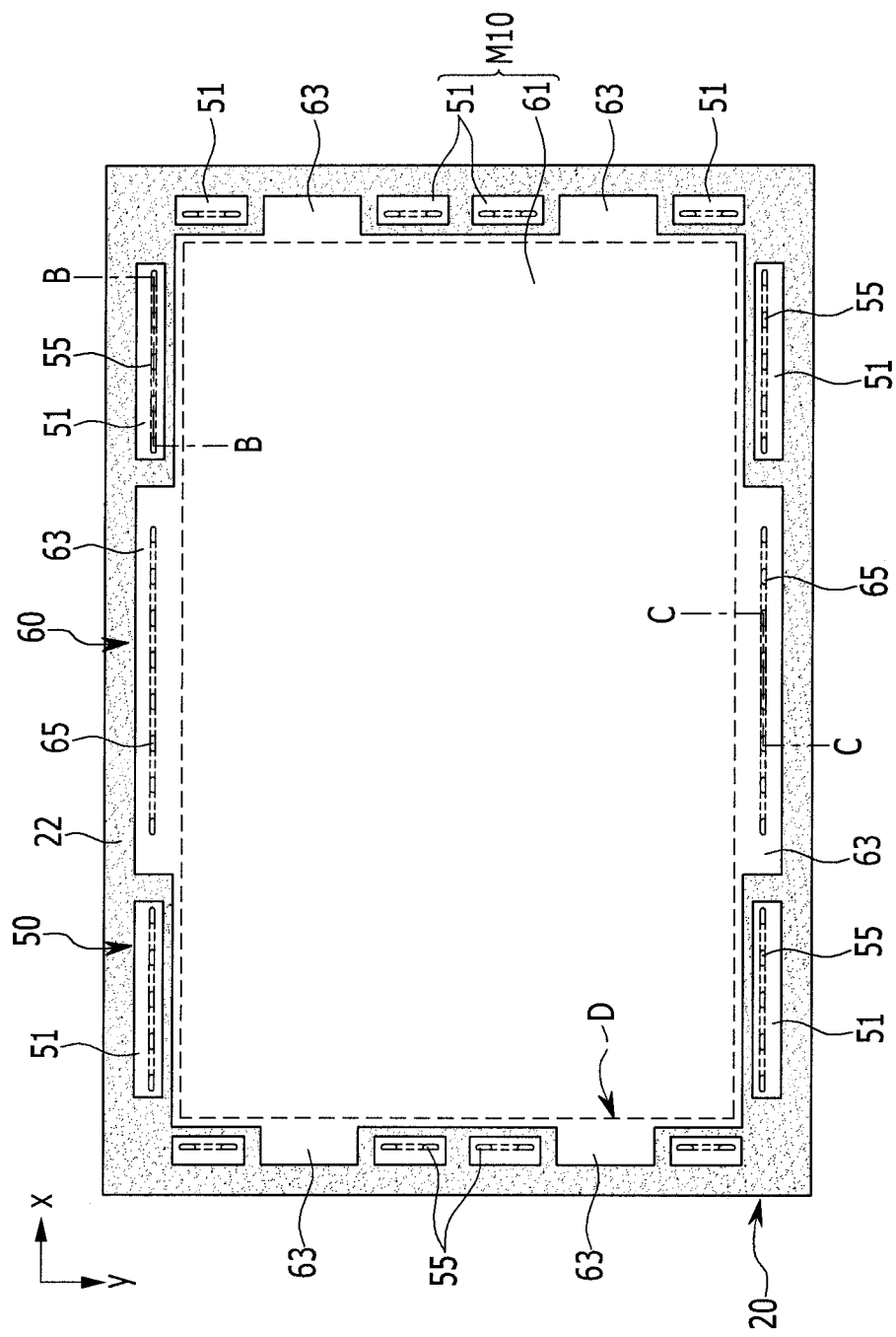
FIG. 15 is a plan view showing the inner surface of a sealing substrate according to a second embodiment.
Figure 16:
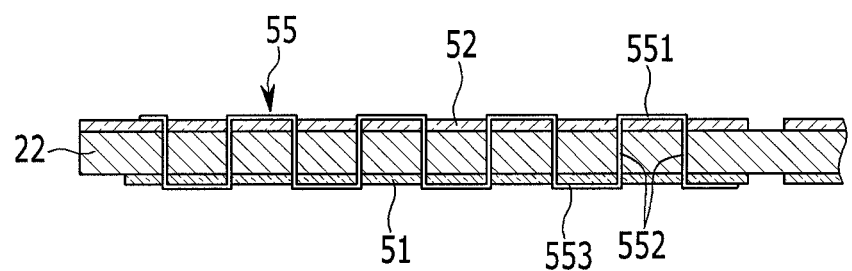
FIG. 16 is a cross-sectional view taken alone line B-B of FIG. 15.
Figure 17:
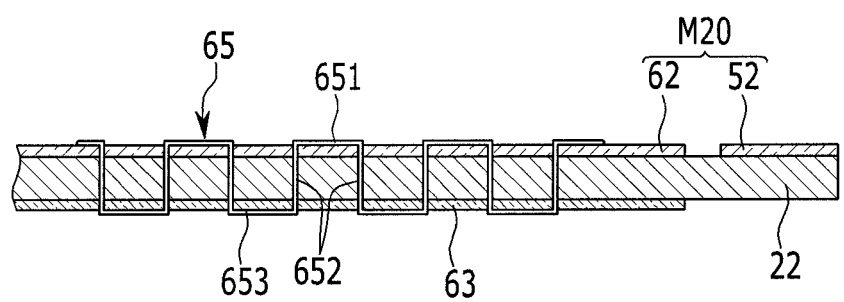
FIG. 17 is a cross-sectional view taken alone line C-C of FIG. 15.

FIG. 15 is a plan view showing the inner surface of a sealing substrate according to a second embodiment, FIG. 16 is a cross-sectional view taken alone line B-B of FIG. 15, and FIG. 17 is a cross-sectional view taken alone line C-C of FIG. 15.

Referring to FIGS. 15 to 17, the organic light emitting diode display according to the second embodiment comprises metal threads as a conductive wire member. The other components except the conductive wire member are identical to those in the first embodiment, so a detailed description thereof will be omitted.

The first conductor 50 comprises a first metal thread 55 that passes through the first outer layer 52, the insulating member 22, and the first inner layer 51 three times or more along one direction of the sealing substrate 20 and is secured to the insulating member 22. The second conductor 60 comprises a second metal thread 65 that passes through the second outer layer 62, the insulating member 22, and at least one extension 63 three times or more alone one direction of the sealing substrate 20 and is secured to the insulating member 22.

The first metal thread 55 allows electrical conduction between the first inner layer 51 and the first outer layer 52, and the second metal thread 65 allows electrical conduction between the extension 63 of the second inner layer 61 and the second outer layer 62. The first metal thread 55 and the second metal thread 65 may be sewn to the insulating member 22 with an industrial sewing machine. The first metal thread 55 and the second metal thread 65 may be metal wires made of Fe, Au, Ag, Cu, etc.

The first metal thread 55 may comprise a plurality of first contact portions 551 being in contact with the outer surface of the first outer layer 52, a plurality of penetrating portions 552 passing through the first outer layer 52, the insulating member 22, and the first inner layer 51, and a plurality of second contact portions 553 being in contact with the outer surface of the first inner layer 51. The second metal thread 65 comprises a plurality of first contact portions 651 being in contact with the outer surface of the second outer layer 62, a plurality of penetrating portions 652 passing through the second outer layer 62, the insulating member 22, and the extension 63, and a plurality of second contact portions 653 being in contact with the outer surface of the extension 63.

In the above-described first and second embodiments, the use of a conductive wire member comprising staples or metal threads makes it easy to provide electrical conduction between the first metal layer M10 and the second layer M20 without forming a through hole in the insulating member 22 and filling a conductive material in the through hole. The conductive wire member can be easily mounted on the sealing substrate 20 by an automation process using an industrial stapler or industrial sewing machine, and the manufacturing costs of the sealing substrate 20 can be lowered.

Figure 18:
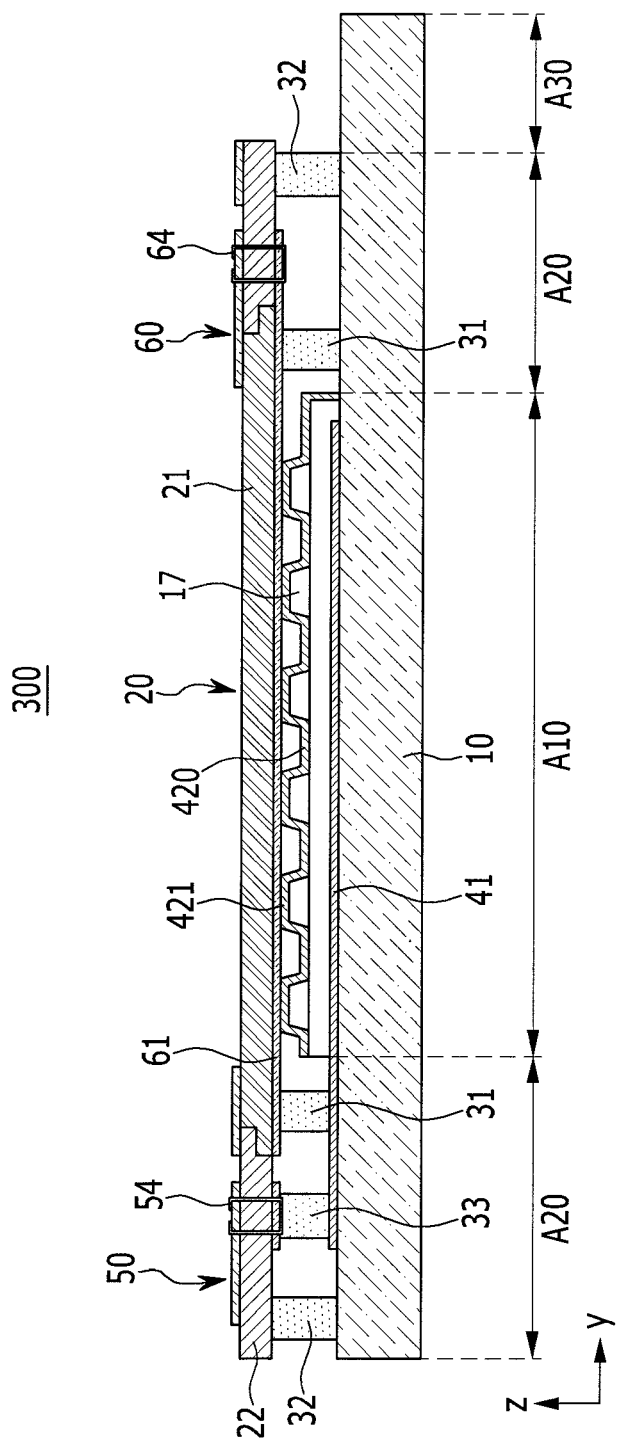
FIG. 18 is a cross-sectional view schematically showing an organic light emitting diode display according to a third embodiment.
Figure 19:
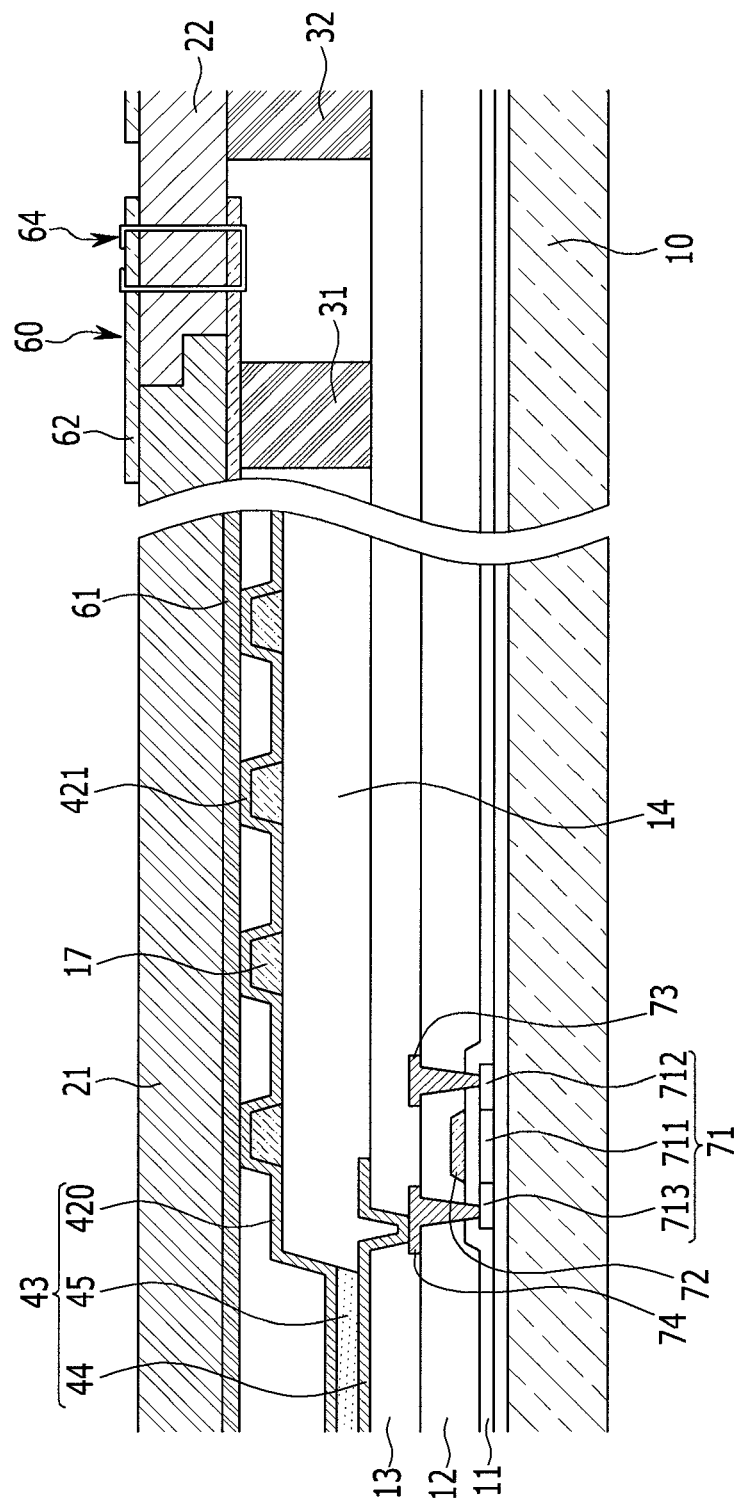
FIG. 19 is a partial enlarged view of the organic light emitting diode display shown in FIG. 18.

FIG. 18 is a cross-sectional view schematically showing an organic light emitting diode display according to a third embodiment. FIG. 19 is a partial enlarged view of the organic light emitting diode display shown in FIG. 18.

Referring to FIG. 18 and FIG. 19, the organic light emitting diode display 300 of the third embodiment has the same configuration as the organic light emitting diode display of the previous first embodiment except that the second pad regions are omitted and the second inner layer 61 formed on the sealing substrate 20 is in contact with the common electrode 420. The same members as those of the first embodiment are denoted by the same reference numerals.

The common electrode 420 has a protrusion and depression structure, i.e., a plurality of projections 421, and the projections 421 are in close contact with the second inner layer 61 formed on the sealing substrate 20. Accordingly, the common electrode 420 is directly connected to the second conductor 60 without passing through the conductive bonding layer 33, and receives a corresponding electrical signal from the second conductor 60.

The protrusion and depression structure of the common electrode 420 may be realized by spacers 17. For example, a plurality of spacers 17 may be formed over a pixel defining film 14, and the common electrode 420 may be formed on the entire display unit while covering the plurality of spacers 17. The common electrode 420 closely contacts with the second inner layer 61 when the substrate 10 and the sealing substrate 20 are bonded together under a pressurized condition.

Figure 20:
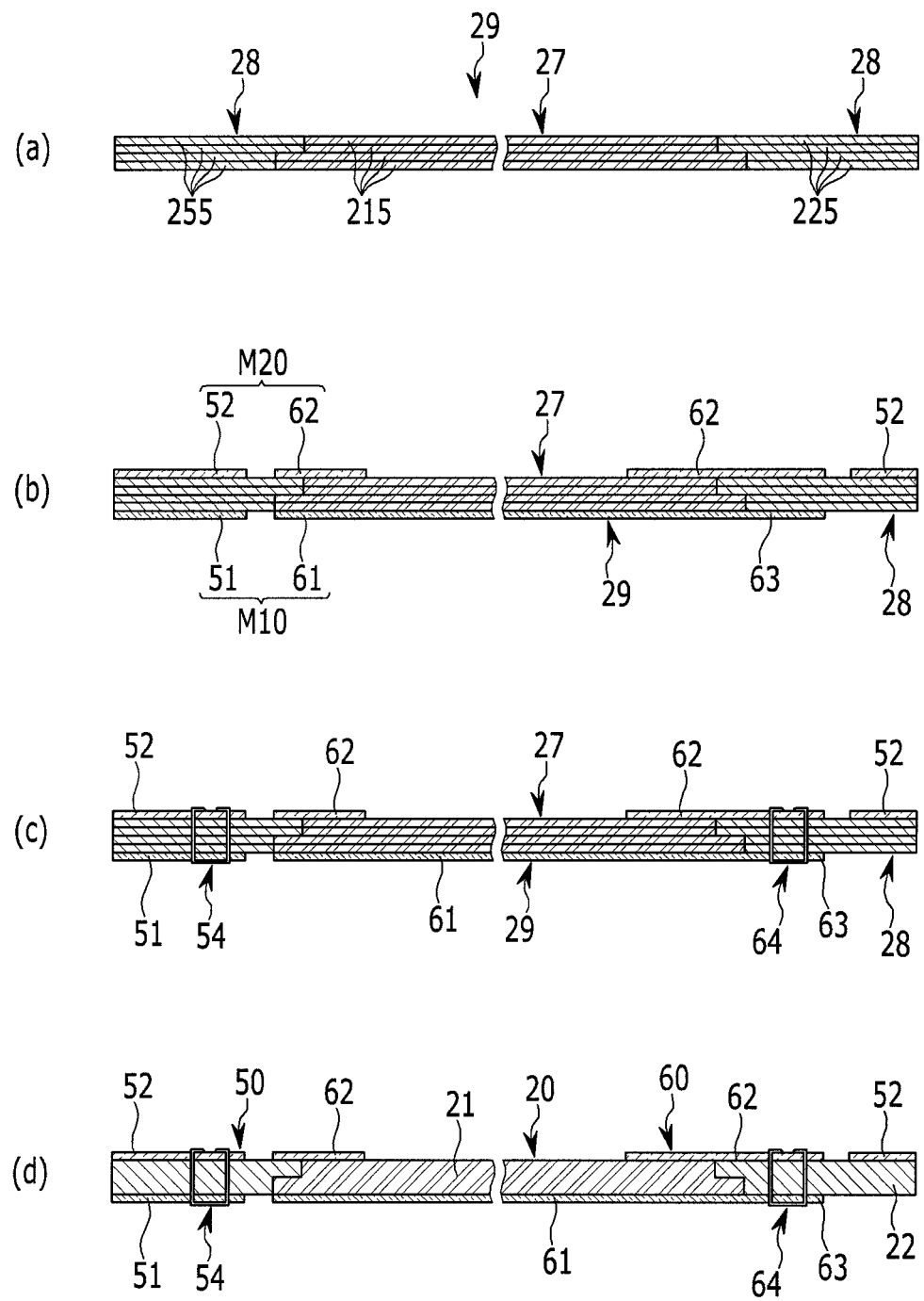
FIG. 20 is a cross-sectional view sequentially showing a manufacturing process of a sealing substrate.

FIG. 20 is a cross-sectional view sequentially showing a manufacturing process of a sealing substrate.

Referring to FIG. 20, the manufacturing method of the sealing substrate 20 comprises: a first step of forming a temporary composite member 27 and a temporary insulating member 28 by laminating a plurality of composite layers 215 and a plurality of insulating layers 225; a second step of disposing a first metal layer M10 on one surface of the lamination structure 29 and a second metal layer M20 on another surface of the lamination structure 29; a third step of providing electrical conduction of the first metal layer M10 and the second metal layer M20 by passing a conductive wire member through the first metal layer M10, the temporary insulating member 28, and the second metal layer M20; and a fourth step of completing a composite member 21 and an insulating member 22 by baking the lamination structure 29 under pressure.

In the first step (see (a)), each of the plurality of composite layers 215 comprises a carbon fiber prepreg having carbon fibers impregnated in a resin matrix. Each of the plurality of insulating layer 225 comprises a fiber reinforced prepreg having reinforcing fibers impregnated in a resin matrix or a polymer resin sheet such as polyethylene terephthalate (PET). The plurality of composite layers 215 and the plurality of insulating layers 225 are easily bendable like fiber, and the temporary composite member 27 and the temporary insulating member 28 are bendable, too.

In the second step (see (b)), the first metal layer M10 comprises first inner layers 51 of a first conductor 50 and a second inner layer 61 of a second conductor 60. The second inner layer 61 is in contact with the temporary composite member 27, and has a plurality of extensions 63 extending toward the temporary insulating member 28. The first inner layers 51 are in contact with the temporary insulating member 28, and are located between the extensions 63.

In the second step, the second metal layer M20 comprises a first outer layer 52 of a first conductor 50 and a second outer layer 62 of a second conductor 60. The first outer layer 52 is in contact with the temporary insulating member 28, and the second outer layer 62 is disposed to be in contact with the temporary composite member 27 and the temporary insulating member 28 at a distance from the first outer layer 52. The first metal layer M10 and the second metal layer M20 are formed from a metal foil containing aluminum or copper.

In the third step (see (c)), the conductive wire member comprises staples or metal threads. FIG. 20 illustrates an example in which the conductive wire member is staples 54 and 64.

If the conductive wire member is staples 54 and 64, the plurality of first staples 54 are embedded into overlapping portions of the first outer layer 52 and the first inner layer 51 of the lamination structure 29 by an industrial stapler to provide electrical conduction between the first outer layer 52 and the first inner layer 51. The first staples 54 pass through the first outer layer 52, the temporary insulating member 28, and the first inner layer 51 and are firmly secured to the temporary insulating member 28.

Moreover, the plurality of second staples 64 are embedded into overlapping portions of the second outer layer 62 and the extensions 63 of the lamination structure 29 by an industrial stapler to provide electrical conduction between the second outer layer 62 and the extensions 63. The second staples 64 pass through the second outer layer 62, the temporary insulating member 28, and the extensions 63 and are firmly secured to the temporary insulating member 28.

If the conductive wire member is metal threads, a first metal thread is successively sewn along one direction onto overlapping portions of the first outer layer 52 and the first inner layer 51 of the lamination structure 29 by an industrial sewing machine to provide electrical conduction between the first outer layer 52 and the first inner layer 51. The first metal thread successively pass through the first outer layer 52, the temporary insulating member 28, and the first inner layer 51 three times or more, and are firmly secured to the temporary insulating member 28.

Moreover, a second metal thread is successively sewn along one direction on overlapping portions of the second outer layer 62 and the extensions 63 of the lamination structure 29 by an industrial sewing machine to provide electrical conduction between the second outer layer 62 and the extensions 63. The second metal thread successively pass through the second outer layer 62, the temporary insulating member 28, and the extensions 63 three times or more, and are firmly secured to the temporary insulating member 28.

In the fourth step (see (d)), the lamination structure 29 is baked under pressure at a high temperature using a hot plate. Therefore, the plurality of composite layers 215 become a hard composite member as they are cured integrally with the resin matrix, and the plurality of insulating layers 225 also become a hard insulating member 22 as they are cured integrally with resin matrix. By providing electrical conduction of the first metal layer M10 and the second metal layer M20 using the conductive wire member before the baking step, the conductive wire member can be easily secured to the flexible temporary insulating member 28.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

| <Description of symbols> | |
|---|---|
| 100: organic light emitting diode display | 10: substrate |
| 20: sealing substrate | 21: composite member |
| 22: insulating member | 31: first bonding layer |
| 32: second bonding layer | 33: conductive bonding layer |
| 35: first pad region | 36: second pad region |
| 40: display unit | 41: common power line |
| 42: common electrode | 50: first conductor |
| 51: first inner layer | 52: first outer layer |
| 54: first staple | 55: first metal thread |
| 60: second conductor | 61: second inner layer |
| 62: second outer layer | 63: extensions |
| 64: second staple | 65: second metal thread |

What is claimed is:

1. A display device comprising:
a substrate;
a display unit formed over the substrate;
a sealing substrate secured to the substrate by a bonding layer, and comprising a composite member and an insulating member;
a first metal layer formed over an inner surface of the sealing substrate facing the substrate;
a second metal layer formed over an outer surface of the sealing substrate; and
a conductive wire member continuously extending and penetrate at least two points of each of the first metal layer, the insulating member, and the second metal layer, and wherein the conductive wire member is secured to the sealing substrate to electrically connect the first metal layer and the second metal layer.

2. The display device of claim 1, wherein the conductive wire member comprising staples or metal threads.

3. The display device of claim 1, wherein the composite member comprises a resin matrix and a plurality of carbon fibers, and
the insulating member is coupled to a periphery of the composite member.

4. The display device of claim 1, wherein the insulating member comprising a polymer resin or a fiber-reinforced composite material, and
the conductive wire member is configured such that conductive wire member is engaged with the insulating member before a baking process.

5. The display device of claim 1, wherein the first metal layer comprises a first inner layer portion being in contact with the insulating member and a second inner layer portion being in contact with the composite member, and
the second metal layer comprises a first outer layer portion and a second outer layer portion that are in contact with the insulating member and wherein the first outer layer portion and a second outer layer portion are disposed at a distance from each other.

6. The display device of claim 2, wherein each of the staples comprises:
a head portion contacting with any one of the first and second metal layers;
a pair of penetrating portions passing through the first metal layer, the insulating member, and the second metal layer; and
a pair of securing portions bent from the penetrating portions and contacting with the other one of the first and second metal layers.

7. The display device of claim 2, wherein each of the metal threads comprises:
a plurality of first contact portions contacting with the first metal layer;
a plurality of penetrating portions passing through the first metal layer, the insulating member, and the second metal layer; and
a plurality of second contact portions contacting with the second metal layer.

8. The display device of claim 4, wherein the fiber-reinforced composite material comprises a resin matrix and a plurality of reinforcing fibers, and
the reinforcing fibers comprises glass fibers or aramid fibers.

9. An organic light emitting diode display comprising:
a substrate;
a display unit formed over the substrate and comprising a common power line and a common electrode;
a sealing substrate secured to the substrate by a bonding layer, and comprising a composite member and an insulating member;
a first conductive wire member and a second conductive wire member, each of which consecutively pass through at least two points of the insulating member, and are secured to the insulating member;
a first conductor formed over the inner and outer surfaces of the sealing substrate, and keeping in an electrically conductive state through the first conductive wire member such that a first electrical signal is applied to the common power line through the first conductor; and
a second conductor formed over the inner and outer surfaces of the sealing substrate, and keeping in an electrically conductive state through the second conductive wire member such that a second electrical signal is applied to the common electrode through the second conductor.

10. The organic light emitting diode display of claim 9, further comprising:
a pad unit located outside the display unit, and including first pad regions connected to a common power line and second pad regions connected to the common electrode; and
a conductive bonding layer located between the first pad regions and the first conductor and between the second pad regions and the second conductor.

11. The organic light emitting diode display of claim 9, further comprising:
first pad regions located outside the display unit and connected to the common power line; and
a conductive bonding layer located between the first pad regions and the first conductor, and
wherein the second conductor is in close contact with the common electrode.

12. The organic light emitting diode display of claim 9, wherein the composite member comprises a resin matrix and a plurality of carbon fibers, and the insulating member is coupled to a periphery of the composite member.

13. The organic light emitting diode display of claim 9, wherein the insulating member comprising a polymer resin or a fiber-reinforced composite material, and
the first conductive wire member and the second conductive wire member are configured such that the first and second conductive wire members are mounted on the insulating member before a baking process.

14. The organic light emitting diode display of claim 10, wherein the common power line further comprises a first common power line and a second common power line that cross each other, and
the first pad regions and the second pad regions are alternately and repeatedly disposed along one direction of the substrate.

15. The organic light emitting diode display of claim 10, wherein the conductive bonding layer is conductive in the thickness direction, and is substantially non-conductive in directions other than the thickness direction.

16. The organic light emitting diode display of claim 11, wherein the organic light emitting diode display further comprises a plurality of spacers disposed under the common electrode, and
the common electrode has projections corresponding to the spacers.

17. The organic light emitting diode display of claim 12, wherein the first conductor comprises: first inner layer portions formed over the inner surface of the insulating member; and a first outer layer portion electrically conducted with the first inner layer portions by the first conductive wire member and formed over the outer surface of the insulating member, and
the second conductor comprises: a second inner layer portion formed across the inner surface of the insulating member and the inner surface of the composite member; and a second outer layer portion electrically conducted with the second inner layer portion by a second conductive wire member and formed over the outer surface of the insulating member.

18. The organic light emitting diode display of claim 13, wherein the fiber-reinforced composite material comprises a resin matrix and a plurality of reinforcing fibers, and
the reinforcing fibers comprise glass fibers or aramid fibers.

19. The organic light emitting diode display of claim 17, wherein the second inner layer portion has a size large enough to face the display unit and has extensions formed over the insulating member, and
the first inner layer portions are located between the extensions at a distance from the extensions.

20. The organic light emitting diode display of claim 17, wherein the second inner layer portion is formed of any one of an aluminum film, a copper film, an aluminum foil, and a copper foil.

21. The organic light emitting diode display of claim 17, wherein the first conductive wire member is formed from a plurality of first staples, and
the second conductive wire member is formed from a plurality of second staples.

22. The organic light emitting diode display of claim 17, wherein the first conductive wire member is formed of a first metal thread, and
the second conductive wire member is formed of a second metal thread.

23. The organic light emitting diode display of claim 21, wherein each of the first staples comprises:

a head portion contacting with any one of the first inner layer portion and the first outer layer portion;
a pair of penetrating portions passing through the first inner layer portion, the insulating member, and the first outer layer portion; and
a pair of securing portions bent from the penetrating portions and contacting with the other one of the first inner layer portion and the first outer layer portion.

24. The organic light emitting diode display of claim 21, wherein each of the second staples comprises:
a head portion contacting with any one of the second inner layer portion and the second outer layer portion;
a pair of penetrating portions passing through the second inner layer portion, the insulating member, and the second outer layer portion; and
a pair of securing portions bent from the penetrating portions and contacting with the other one of the second inner layer portion and the second outer layer portion.

25. The organic light emitting diode display of claim 22, wherein the first metal thread comprises:
a plurality of first contact portions being in contact with the first inner layer portion;
a plurality of penetrating portions passing through the first inner layer portion, the insulating member, and the first outer layer portion; and
a plurality of second contact portions being in contact with the first outer layer portion.

26. The organic light emitting diode display of claim 22, wherein the second metal thread comprises:
a plurality of first contact portions being in contact with the second inner layer portion;
a plurality of penetrating portions passing through the second inner layer portion, the insulating member, and the second outer layer portion; and
a plurality of second contact portions being in contact with the second outer layer portion.

27. A manufacturing method of a sealing substrate, the method comprising:
providing a lamination structure including a composite member and an insulating member, wherein the lamination structure comprises a first surface and a second surface facing away from the first surface;
disposing a first metal layer over the first surface of the lamination structure and a second metal layer over the second surface of the lamination structure; and
providing electrical conduction of the first metal layer and the second metal layer by passing a conductive wire member through the first metal layer, the unfinished insulating member, and the second metal layer.

28. The method of claim 27, further comprising, after providing electrical conduction of the first metal layer and the second metal layer, curing the composite member and the insulating member.

29. The method of claim 27, wherein the composite member comprises a plurality of composite layers, and the insulating member comprises insulating layers.

30. The method of claim 27, wherein the first metal layer comprises first inner layer portions being in contact with the insulating member and a second inner layer portion located across the composite member and the insulating member, and
the second metal layer comprises a first outer layer portion and a second outer layer portion disposed over the insulating member at a distance from each other.

31. The method of claim 27, wherein the conductive wire member comprises a stapler, and wherein providing electrical conduction comprises stapling overlapping portions of the first metal layer and the second metal layer with the staple using an industrial stapler.

32. The method of claim 27, wherein the conductive wire member comprises a metal thread, and
wherein providing electrical conduction comprises stitching overlapping portions of the first metal layer and the second metal layer with the metal thread using a sewing machine.

33. The method of claim 29, wherein each of the plurality of composite layers comprises a carbon fiber prepreg comprising a resin matrix and a plurality of carbon fibers, and
each of the plurality of insulating layers comprises a fiber reinforced prepreg comprising a resin matrix and reinforced fiber, or a polymer resin sheet.

* * * * *